United States Patent [19]

Suzuki et al.

[11] Patent Number: 4,501,766
[45] Date of Patent: Feb. 26, 1985

[54] FILM DEPOSITING APPARATUS AND A FILM DEPOSITING METHOD

[75] Inventors: Katsumi Suzuki; Shuji Yoshizawa, both of Tokyo, Japan

[73] Assignee: Tokyo Shibaura Denki Kabushiki Kaisha, Japan

[21] Appl. No.: 457,231

[22] Filed: Jan. 11, 1983

[30] Foreign Application Priority Data

Feb. 3, 1982 [JP] Japan .................................. 57-15870
Feb. 3, 1982 [JP] Japan .................................. 57-15871
Feb. 3, 1982 [JP] Japan .................................. 57-15877

[51] Int. Cl.³ .......................... B05D 3/06; C23C 13/08
[52] U.S. Cl. ..................................... 427/38; 118/50.1; 118/723; 118/729; 118/730; 118/733; 427/39; 427/240; 427/255
[58] Field of Search ........................ 427/255.5, 240, 38, 427/39; 118/730, 733, 50.1, 729, 723

[56] References Cited

U.S. PATENT DOCUMENTS

| | | | |
|---|---|---|---|
| 2,995,463 | 8/1961 | Meister et al. | 118/723 |
| 3,865,072 | 2/1975 | Kirkman | 118/730 |
| 4,225,222 | 9/1980 | Kempler | 427/39 |

FOREIGN PATENT DOCUMENTS

| | | |
|---|---|---|
| 0060651 | 9/1982 | European Pat. Off. |
| 2951453 | 7/1980 | Fed. Rep. of Germany . |
| 54-86341 | 7/1979 | Japan . |
| 54-99441 | 8/1979 | Japan . |
| 1281539 | 7/1972 | United Kingdom . |
| 1328838 | 9/1973 | United Kingdom . |
| 1534833 | 12/1978 | United Kingdom . |

OTHER PUBLICATIONS

IBM Technical Disclosure Bulletin, vol. 18, No. 5, Oct. 1975.

Primary Examiner—Norman Morgenstern
Assistant Examiner—Janyce A. Bell
Attorney, Agent, or Firm—Cushman, Darby & Cushman

[57] ABSTRACT

A film depositing apparatus forms a film with a given thickness on each of a plurality of bases. The apparatus is provided with a casing removably mounted on a base section to form a film depositing chamber whose interior is isolated from the outside space; transfer mechanism for transferring the plurality of bases in one direction inside the film depositing chamber; gas supplying mechanism for feeding material gas into the casing, the gas supplying mechanism including injecting portions arranged along said one direction in the film depositing chamber to inject the material gas in the casing into the film depositing chamber along said one direction; and electric discharge mechanism for activating the material gas injected into the film depositing chamber by the injecting portions.

18 Claims, 35 Drawing Figures

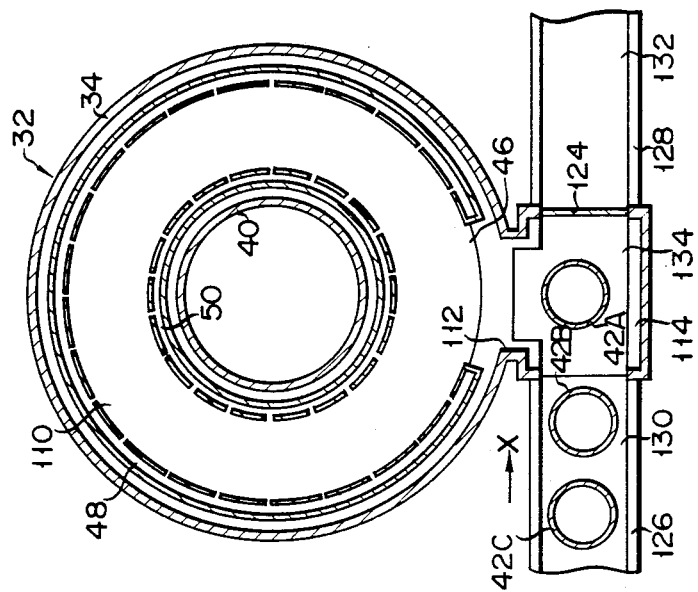
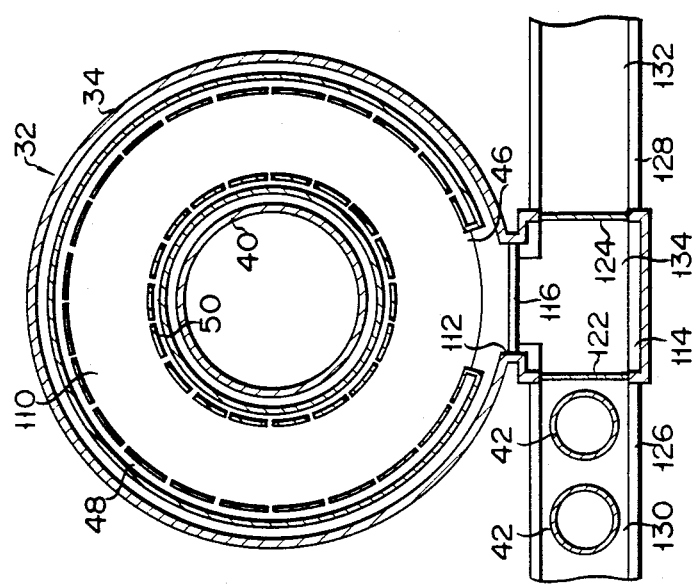

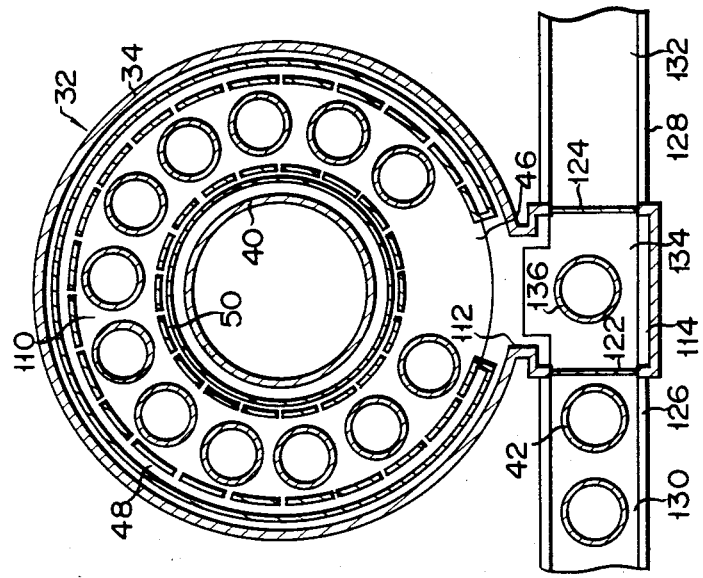
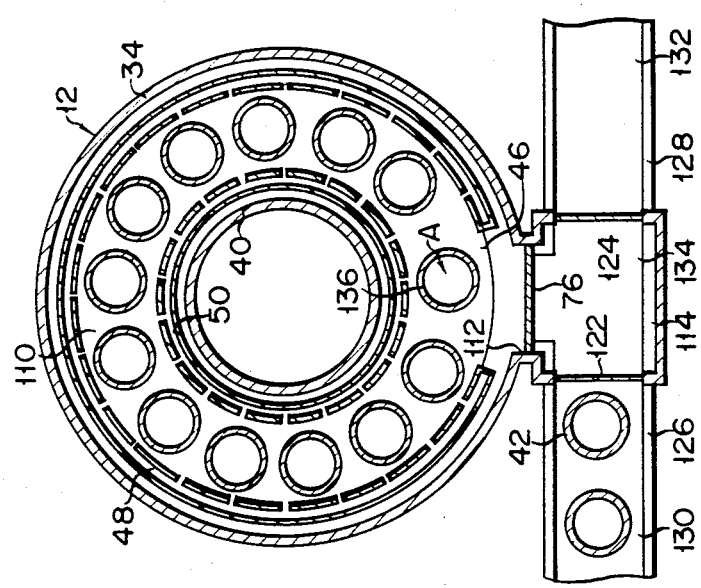

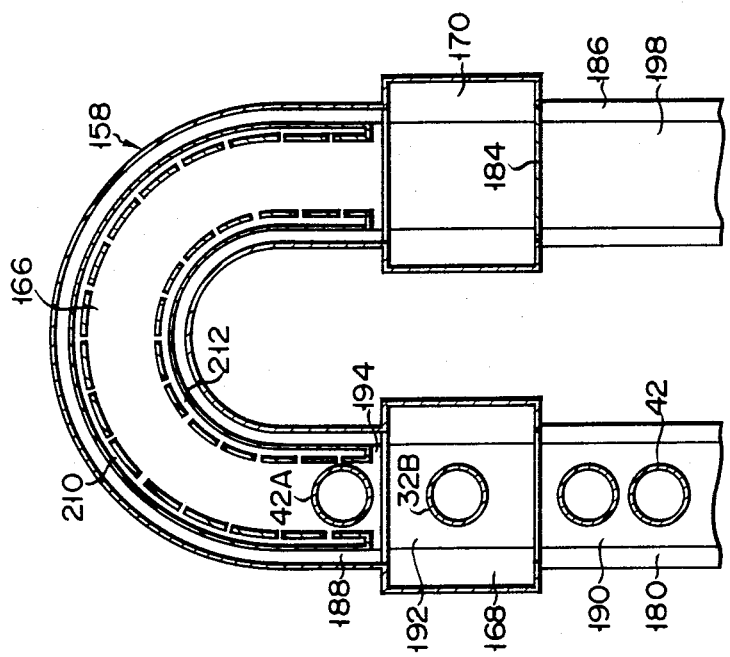
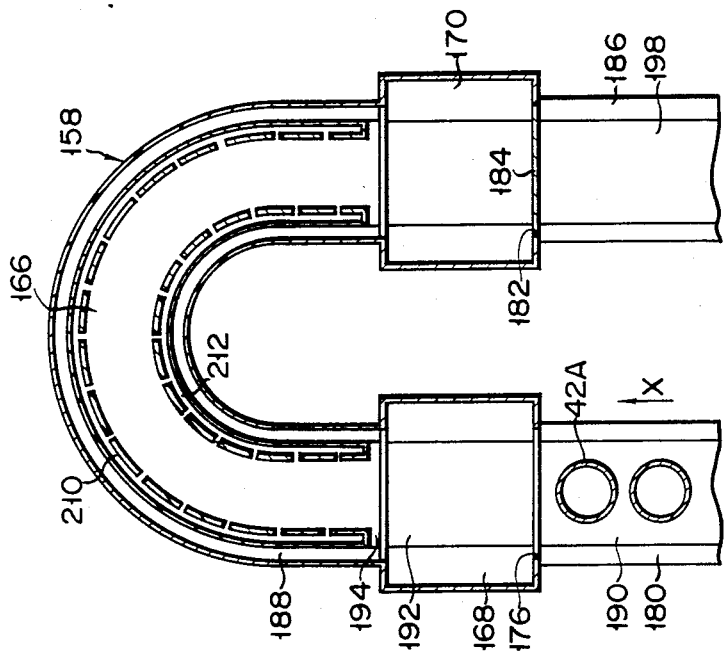

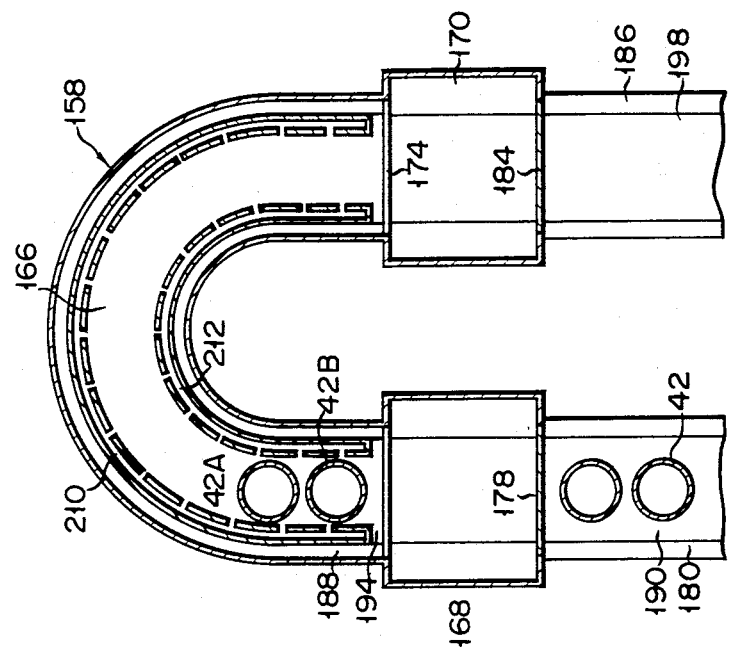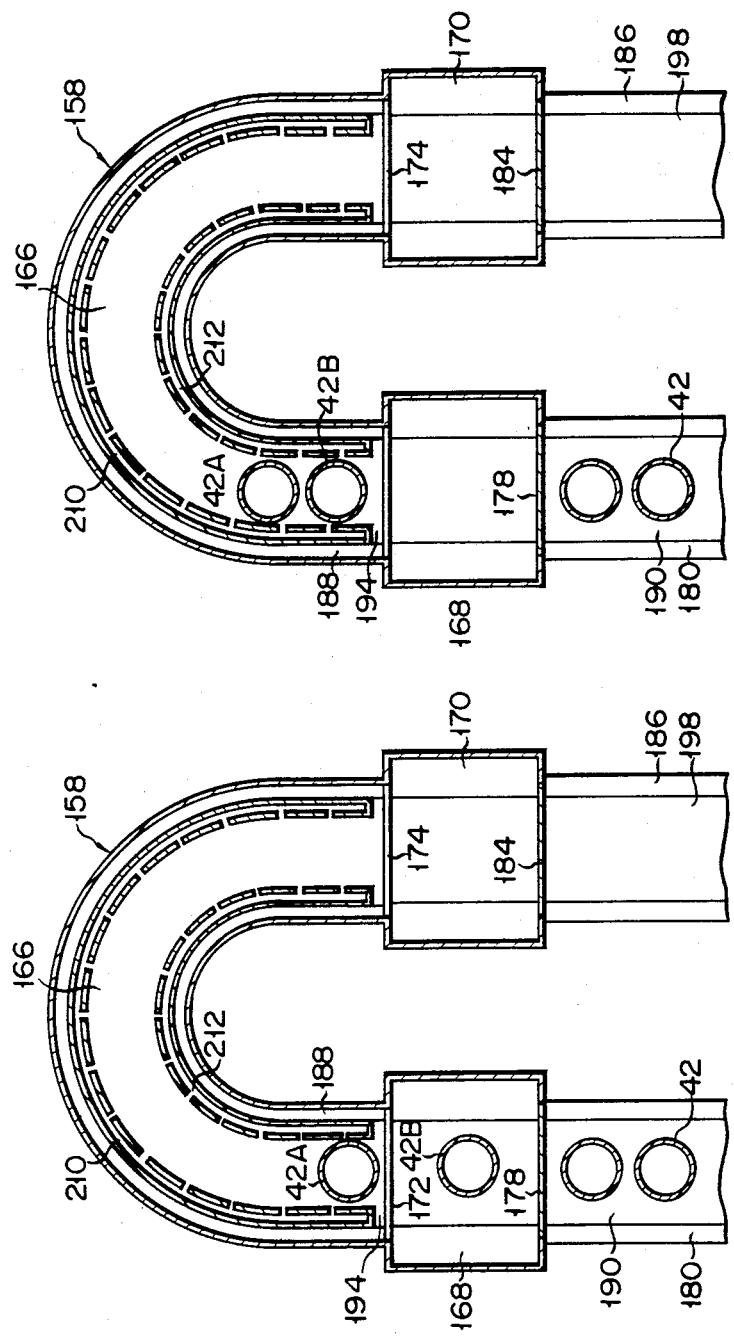

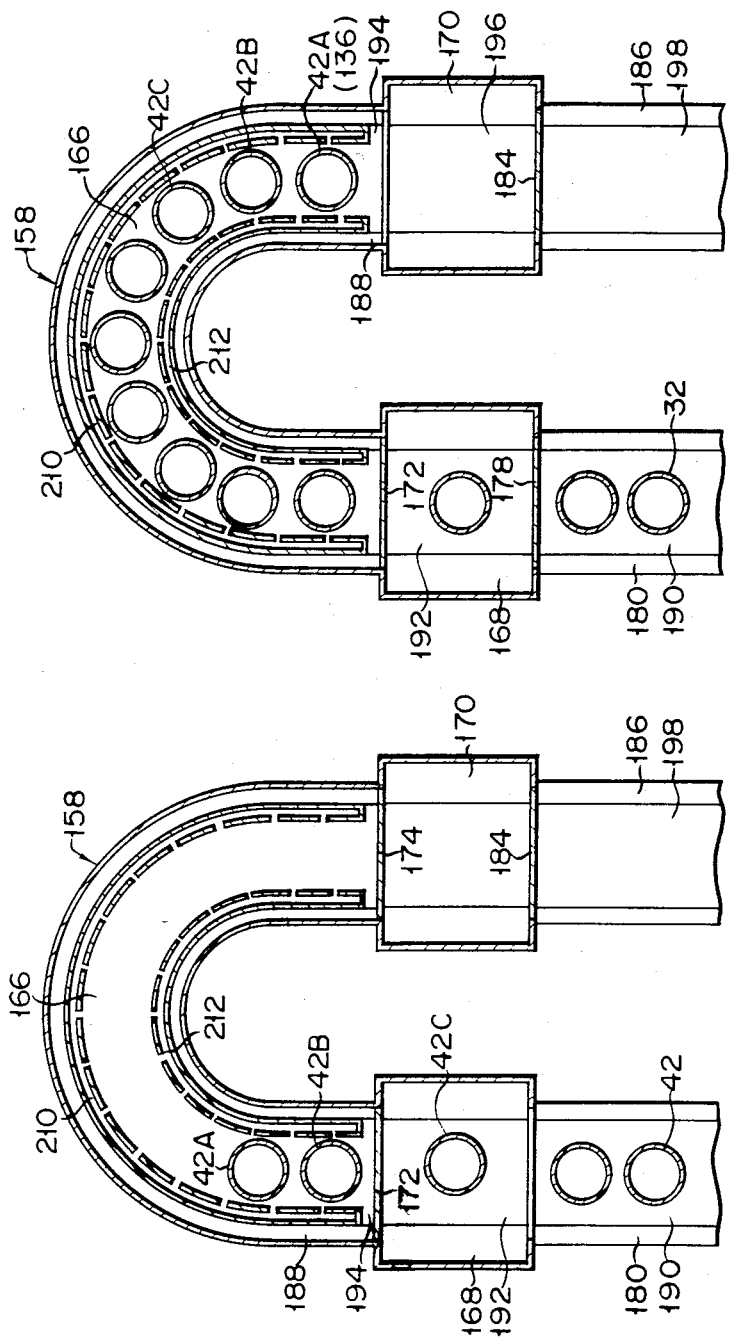

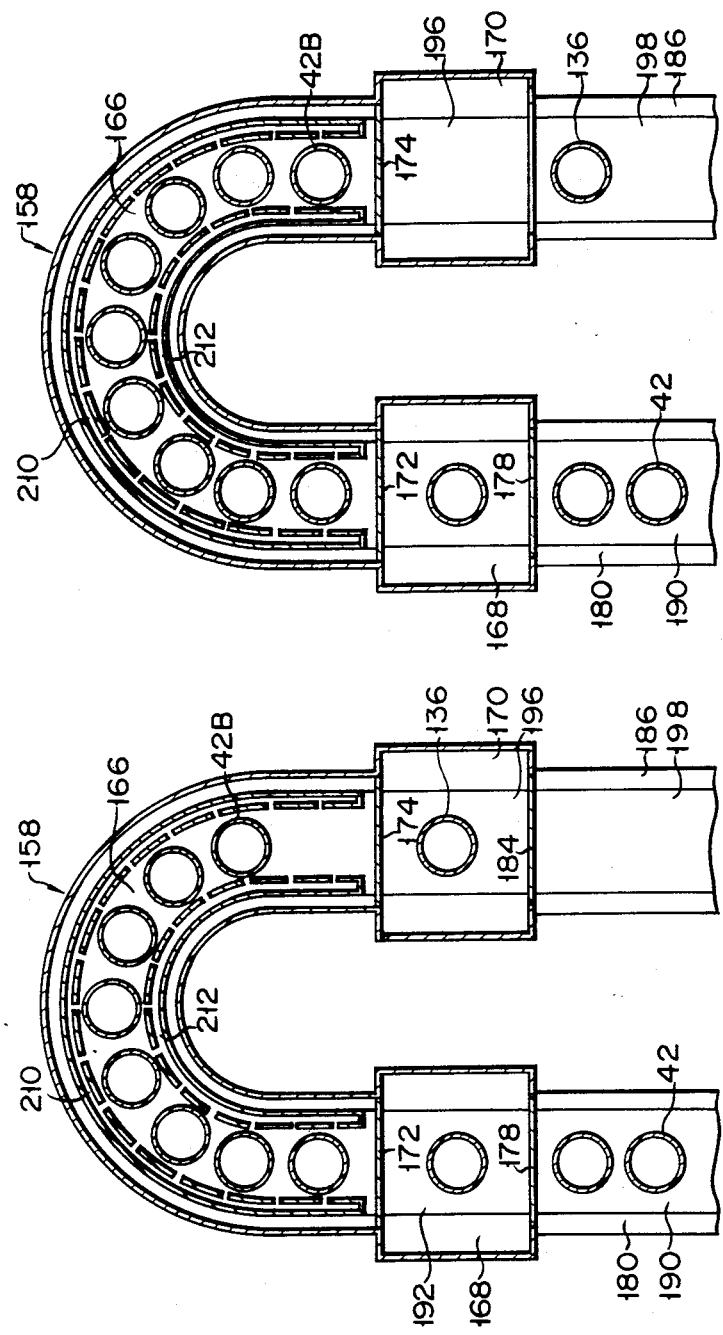
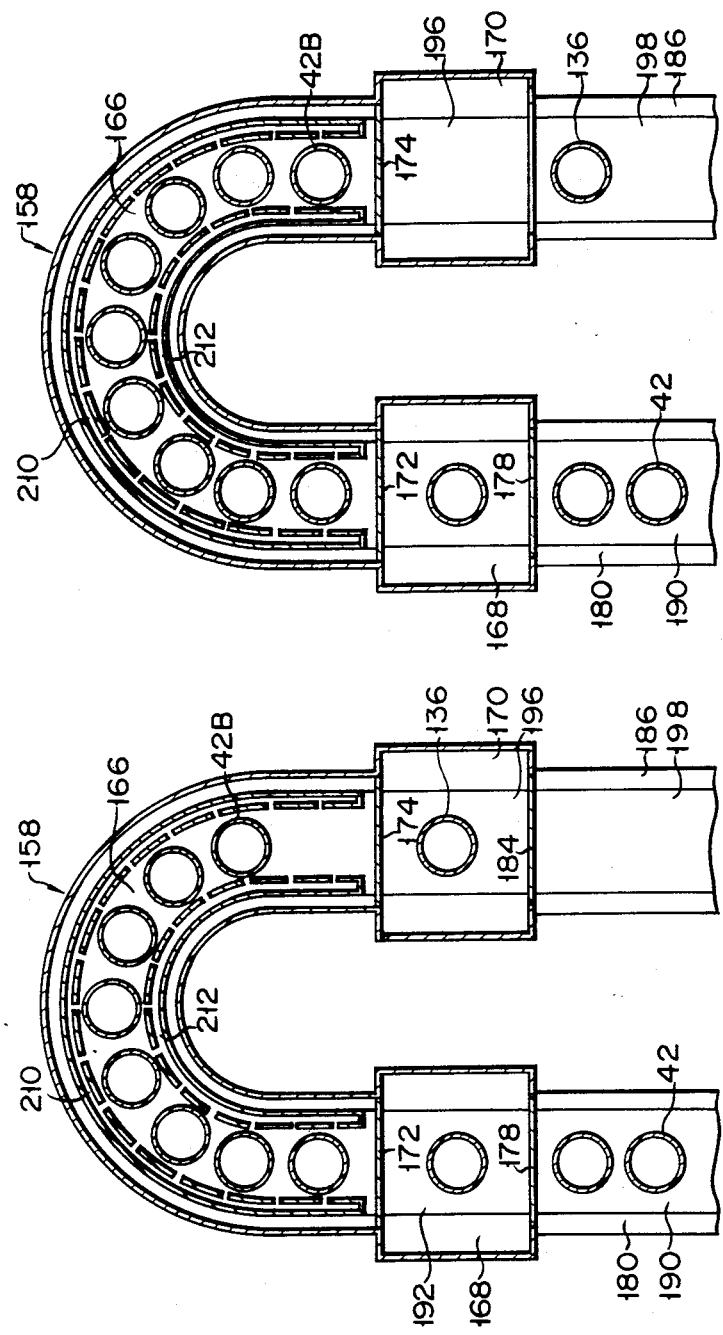

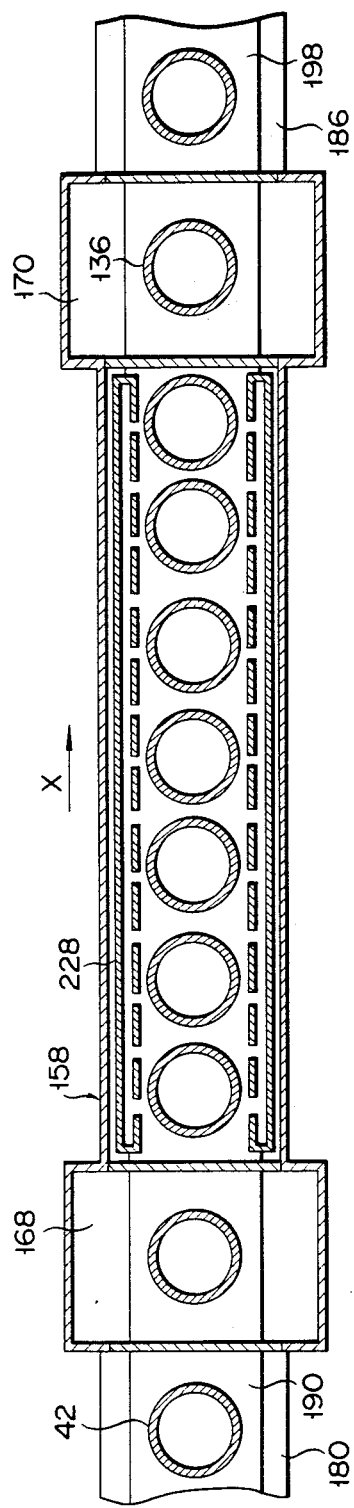
F I G. 34
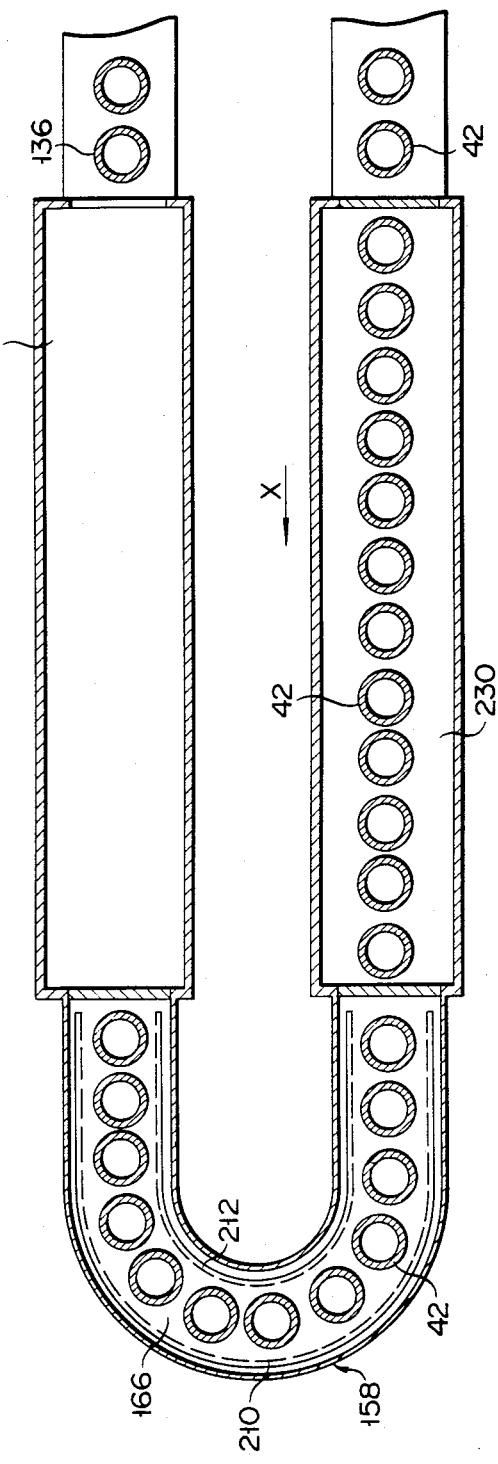
F I G. 35

4,501,766

FILM DEPOSITING APPARATUS AND A FILM DEPOSITING METHOD

BACKGROUND OF THE INVENTION

This invention relates to a film depositing apparatus and a method for depositing a film on the surface of a base.

Recently, in the field of electronic copying machines, the use of an amorphous silicon photoconductor for a photosensitive layer has been proposed. A photosensitive body with an amorphous silicon photoconductor as a photosensitive layer (hereinafter referred to simply as an α-Si photosensitive body) is superior to those materials, such as α-Se, CdS, ZnO, O.P.C., etc. (which are presently used as photosensitive layers for electronic copying machines) with regard to properties such as thermal resistance, hardness, durability and non-polluting effect.

The α-Si photosensitive body is manufactured by, for example, the glow discharge method as follows. As shown in FIGS. 1 and 2, a drum-shaped base 12 is rotatably housed in a casing 10. A vacuum is previously formed inside the casing 10 by a diffusion pump and a rotary pump (not shown). The base 12 is grounded, and is rotated about its own axis by a drive mechanism (not shown). When a valve 18 is opened, $SiH_4$ (silane) gas or a mixture of $SiH_4$ and $B_2H_6$ or of $SiH_4$ and $PH_3$, as required, is led into the casing 10. At the same time, an exhaust system is shifted from the position where it is connected to the diffusion pump and the rotary pump (not shown) to the position where it is connected to a mechanical booster pump 14 and a rotary pump 16. The introduced gas is blown against the surface of the base 12 through a number of gas nozzles 22 of a gas inlet pipe 20. The base 12 is heated by a heater 24. The gas inlet pipe 20 serves also as the cathode of a radio-frequency power source 26. After the internal pressure of the casing 10 is adjusted to a predetermined level by controlling a valve (not shown) included in the exhaust system, radio-frequency power from the power source 26 is applied between the cathode 20 and the base 12. Since the base 12 is grounded, it functions as an anode compared with the cathode 20. As a result, glow discharge is caused between the gas inlet pipe 20 as the cathode and the base 12 as the anode to activate (or ionize) the $SiH_4$ gas. Thus, with the passage of time, α-Si develops over the surface of the base 12. Consequently during the deposition of the α-Si film, the radical of $SiH_4$ gas, which hs not taken part in the film deposition, is sucked out from the casing 10 by the mechanical booster pump 14 and the rotary pump 16, a photosensitive layer of α-Si is deposited on the surface of the base 12 to a given thickness. Thereafter, the radical of the $SiH_4$ gas is safely discharged to the outside air through a combustion tower and a scrubber (not shown) in succession. Then, the casing 10 is opened, and the α-Si photosensitive body is taken out therefrom. Thus, the manufacture of a single α-Si photosensitive body is completed.

In the manufacture of the α-Si photosensitive body in this manner, however, the film depositing speed is extremely low, and preprocessing for evacuating the casing 10 and post-processing for discharging the residual radical of $SiH_4$ in the casing 10 are substantially prolonged which lowers productivity. Thus, the manufacturing cost of the α-Si photosensitive body obtained is very high.

To eliminate these drawbacks, there is conventionally proposed a method in which a plurality of drum-shaped bases 12 are arranged axially, as shown in FIG. 3, so that α-Si films may be simultaneously deposited on the multitude of bases 12. According to this method, however, the number of bases 12 set in the casing 10 are limited because of the height limit of the casing 10, and the casing 10 makes inserting and removing the bases 12 inconvenient. With this film depositing method, moreover, vacuum pumps (not shown) are required to be mounted at the lower portion of the casing 10. Accordingly, the gas density inside the casing 10 is not uniform, so that the photosensitive layers of α-Si deposited on the bases 12 are subject to variation in thickness. This is a fatal drawback.

SUMMARY OF THE INVENTION

This invention was created in consideration of the aforementioned problems, and is intended to provide a film depositing method and an apparatus therefore, capable of efficiently manufacturing a large number of filmed bases of uniform film thickness.

BRIEF DESCRIPTION OF THE DRAWINGS

FIGS. 10 to 20 are cross-sectional views for illustrating the operation of the apparatus of the invention;

FIGS. 26 to 33 are cross-sectional views for illustrating the operation of the apparatus of the invention;

FIG. 34 is a cross-sectional view schematically showing a film depositing apparatus according to a seventh embodiment of the invention; and FIG. 35 is a cross-sectional view schematically showing a film depositing apparatus according to an eighth embodiment of the invention.

DETAILED DESCRIPTION OF THE PREFERRED EMBODIMENTS

Figure 1:
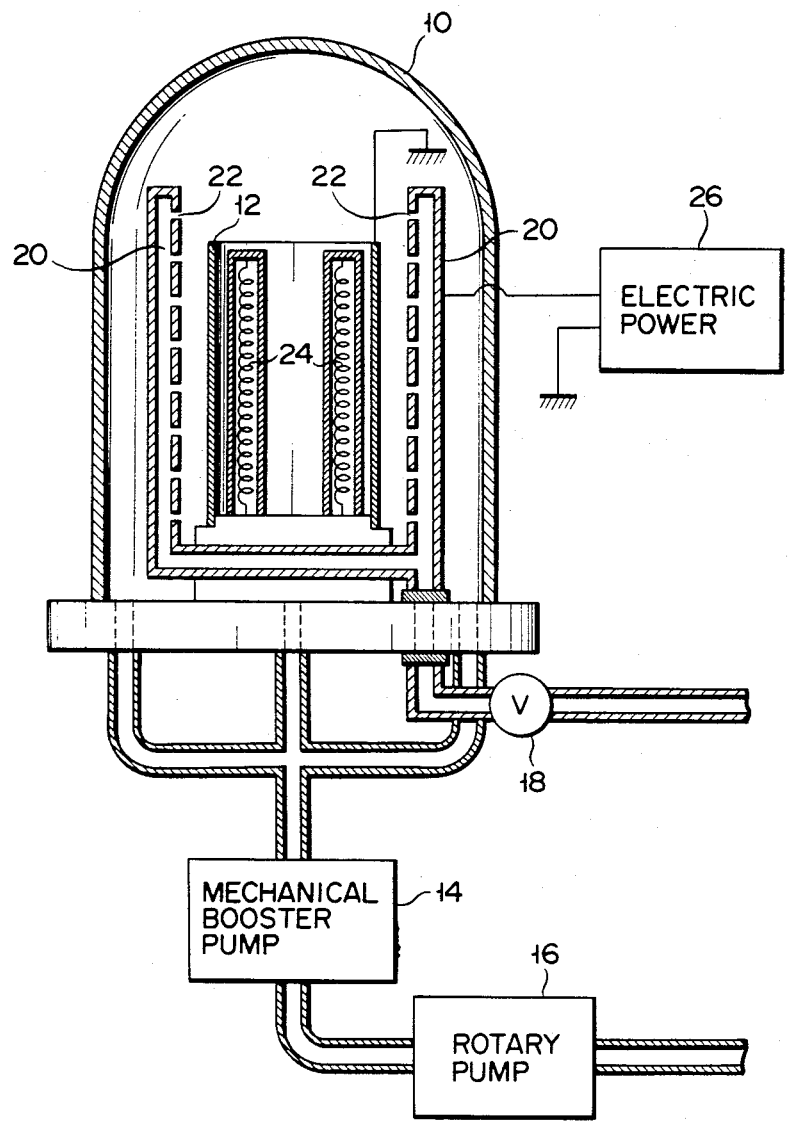
FIG. 1 is a longitudinal sectional view of a prior art film depositing apparatus.
Figure 2:
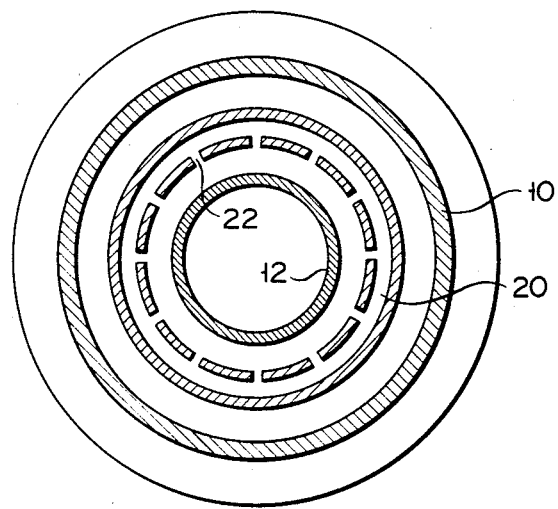
FIG. 2 is a cross-sectional view of the apparatus of FIG. 1.
Figure 3:
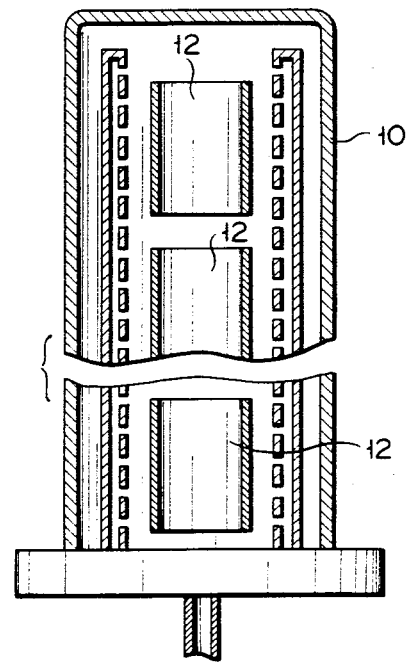
FIG. 3 is a longitudinal sectional view schematically showing another prior art film depositing apparatus.
Figure 4:
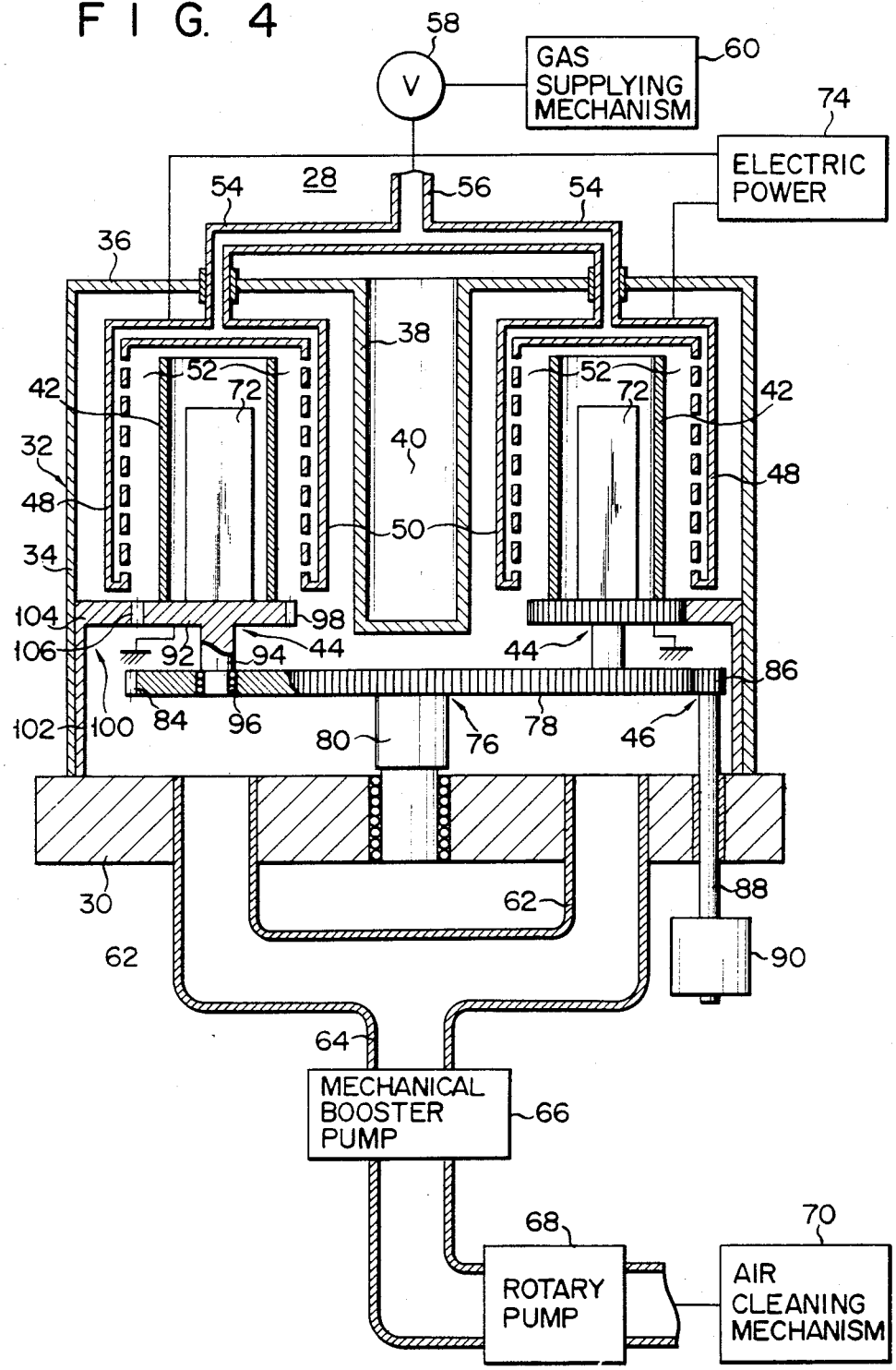
FIG. 4 is a longitudinal sectional view schematically showing a film depositing apparatus according to a first embodiment of this invention.
Figure 5:
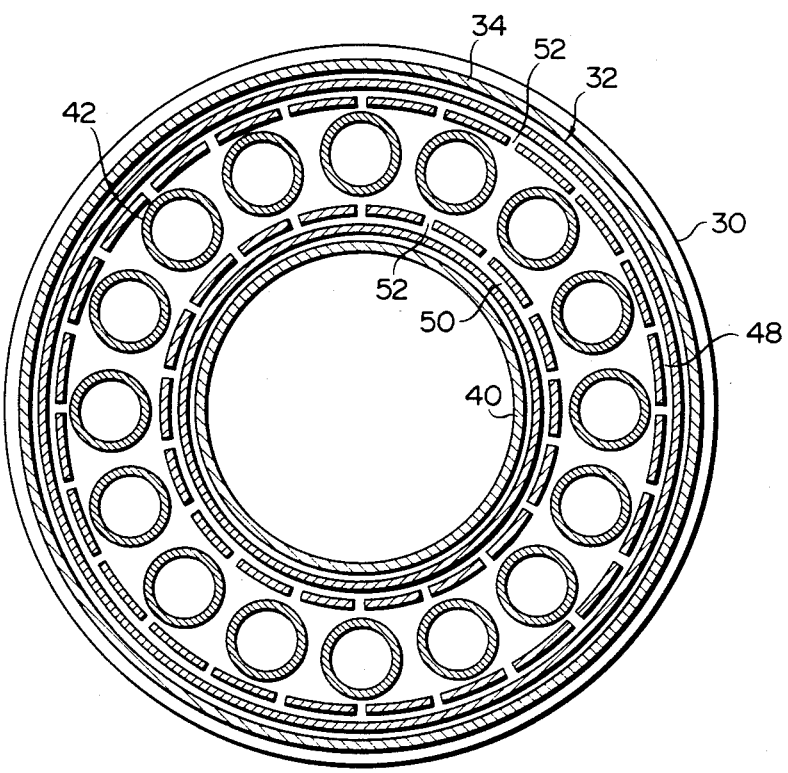
FIG. 5 is a cross-sectional view of the apparatus of FIG. 4.
Figure 6:
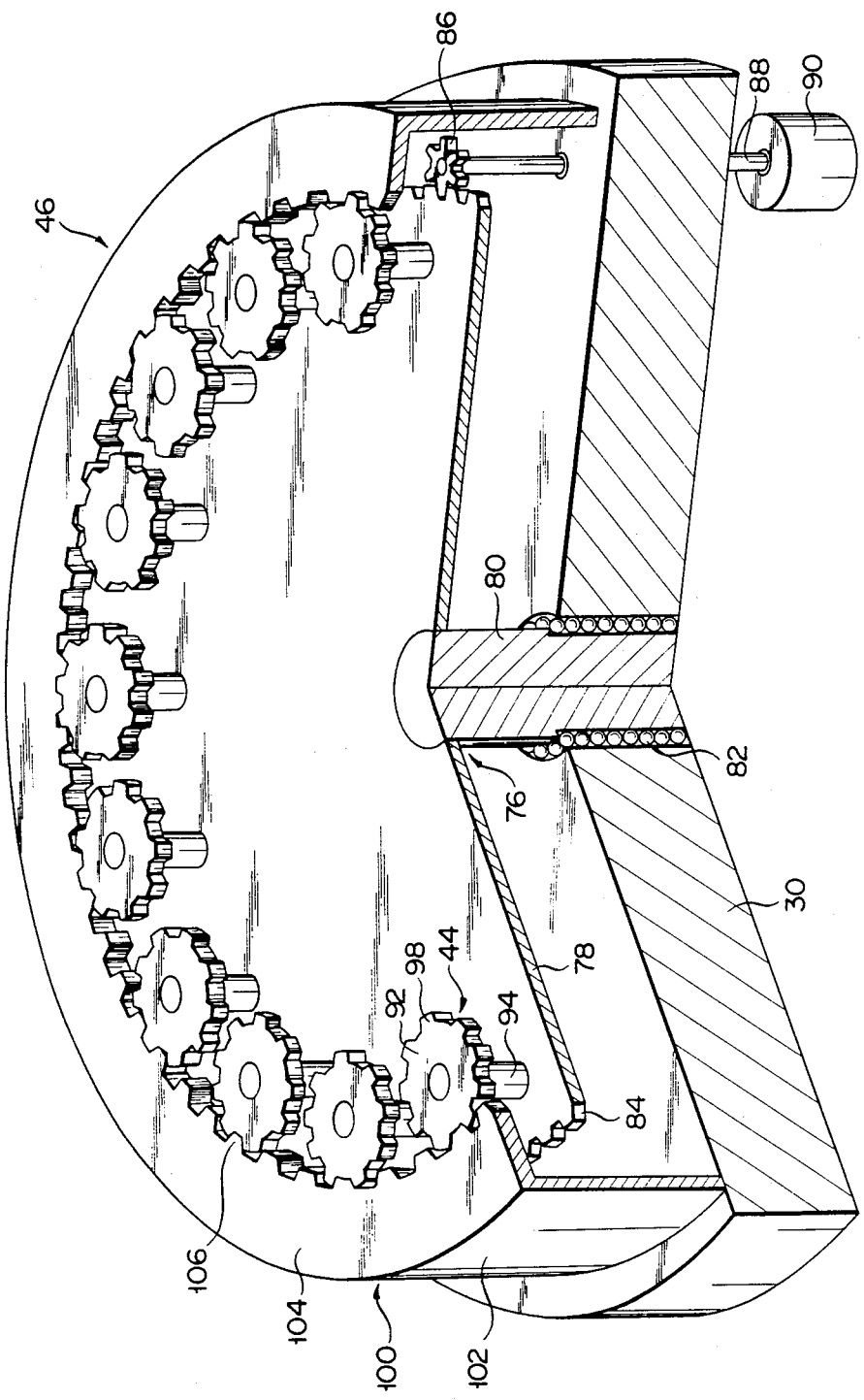
FIG. 6 is a partially broken perspective view of a drive mechanism shown in FIG. 4.

Referring now to FIGS. 4 to 6, there will be described a film depositing apparatus according to a first embodiment of this invention which is applied to an apparatus for manufacturing an amorphous silicon photosensitive body.

As shown in FIGS. 4 and 5, a film depositing apparatus 28 includes a discoid base section 30. A casing 32 is mounted on the base section 30 so as to cover the whole upper surface thereof. The casing 32 can be detached from the base section 30, and keeps the inside space 31 of the casing 32 airtight when attached to the base section 30. The casing 32 rises upright from the outer peripheral portion of the upper surface of the base section 30, and has an outer peripheral wall 34 concentric with the base 30 and a top plate 36 covering the upper end edge of the outer peripheral wall 34. A hollow 38 is formed in the central portion of the top plate 36. A wall 40 forming the lateral face of the hollow 38 is defined as the inner peripheral wall of the casing 32.

Inside the casing 32, as shown in FIG. 6, sixteen stands 44 to hold cylindrical bases 42 of photosensitive drums for photosensitive bodies are arranged over the base section 30. The stands 44 are arranged at regular intervals along the circumference of a circle around the central axis of the casing 32, standing upright with their central axes perpendicular. The stands 44 are rotated on their own central axes (rotation) and around the center of the base section 30 (revolution) by means of a first drive mechanism 46 mentioned later.

Inside the casing 32, moreover, first and second gas inlet portions 48 and 50 are arranged along the outer and inner peripheral walls 34 and 40, respectively. The gas inlet portions 48 and 50 are hollow cylinders formed of conductive material and coaxial with the casing 32. A number of gas nozzles 52 are uniformly formed in the inner peripheral surface of the first gas inlet portion 48 and the outer peripheral surface of the second gas inlet portion 50. A gas inlet branch sleeve 54 is connected to the respective upper surfaces of the first and second gas inlet portions 48 and 50, arranged circumferentially at regular intervals. The gas inlet branch sleeve 54 is to a common gas inlet main pipe 56, which is connected to a gas supplying mechanism 60 through a valve 58. The gas supplying mechanism 60 is intended to supply $SiH_4$ gas. The gas inlet branch pipes 54 penetrate the top plate 36 of the casing 32 in an airtight manner to be led into the casing 32.

One end of each of a number of gas outlet branch pipes 62 penetrating the base section 30 open on the upper surface of the base section 30. The gas outlet branch pipes 62 are arranged at regular intervals along the circumference of a circle around the central axis of the casing 32, and are coupled to a common gas outlet main pipe 64. The gas outlet main pipe 64 is connected to an air cleaning mechanism 70 through a mechanical booster pump 66 and a rotary pump 68. The air cleaning mechanism 70 includes a combustion tower, scrubber (not shown), etc., and cleans gas which is discharged from the casing 32.

Heaters 72 for heating the bases 42 on the stand 44 are mounted individually on the stands 44. The bases 42 on the stands 44 are grounded by means of the stands 44.

The first and second gas inlet portions 48 and 50 are connected to a common radio-frequency power source 74. In other words, the first and second gas inlet portions 48 and 50 function as a cathode by the agency of the power source 74, while the bases 42 function as an anode. The power source 74 can supply a.c. current for output power up to 5 kW and at frequency of 13.56 MHz.

Each of the bases 42 is formed of a conductive, thin-walled cylindrical body with an outside diameter of 130 mm. A film of α-Si is deposited over the whole outer peripheral surface of the base 42 to a predetermined thickness in accordance with the processes to be mentioned later. The casing 32, which is to house the sixteen bases 42 of that size, may have an outside diameter of 130 cm.

Now the first drive mechanism 46 for the stands 44 will be described in detail.

As shown in FIG. 6, the first drive mechanism 46 includes a drive mount 76 coaxially set on the upper surface of the base section 30. The drive mount 76 has a discoid table 78 and a main shaft 80 coaxially fixed to the lower surface of the table 78. The main shaft 80 is attached to the base section 30 by means of a bearing 82 so as to be rotatable around the central axis of the base section 30. A first gear 84 is formed over the whole outer peripheral surface of the table 78. A driving gear 86 is disposed at the outer periphery of the table 78 so as to be in mesh with the first gear 84. The driving gear 86 is connected to a motor 90 under the base section 30 by means of a driving shaft 88. The driving shaft 88 vertically penetrates the base section 30.

Each of the stands 44 has a discoid rest 92 on which to hold the base 42 and a rotating shaft 94 coaxially fixed to the lower surface of the rest 92. The rotating shaft 94 is rotatably attached to the table 78 by means of a bearing 96 (FIG. 4). A second gear 98 as a pinion is formed over the whole outer peripheral surface of the rest 92. A gear portion 100 is fixed to the base section 30 at the outer peripheries of the sixteen circumferentially arranged stands 44. The fixed gear portion 100 includes a cylindrical upright strip 102 standing on the base section 30, and a flange portion 104 projecting radially inward from the upper end edge of the upright strip 102. The center of the inner peripheral edge of the flange portion 104 is in alignment with the center of the base section 30. A fixed gear 106 as a rack in the form of an internal gear is formed over the whole inner peripheral surface of the flange portion 104. The fixed gear 106 is in mesh with the respective second gears 98 of the stands 44.

When the motor 90 is started, the driving gear 86 is rotated, and the drive mount 76 in mesh with the driving gear 86 is rotated around the central axis of the base section 30. Accordingly, the stands 44 or the bases 42 move or revolve around the central axis of the base section 30 to describe a circular locus.

Since the stands 44 are in mesh with the fixed gear 106 fixed to the base section 30, they are rotated about their respective rotating shafts 94 as they revolve around the central axis of the base section 30. That is, the stands 44 or the bases 42 rotate about their own axes.

There will now be described the film depositing operation of the apparatus according to the first embodiment constructed in the aforementioned manner.

First, the casing 34 is removed from the base section 30, and the sixteen drum-shaped bases 42 are set individually on the stands 44. Then, the casing 34 is attached to the base section 30, and a vacuum of $10^{-5}$ torr is created inside the casing 34 by means of a diffusion pump and a rotary pump (not shown). At the same time, the bases 42 are heated from 200° C. to 300° C. by the heaters 72. In this state, the valve 58 is opened to lead SiH4 gas from the gas supplying mechanism 60 to the first and second gas inlet portions 48 and 50 through the gas inlet main pipe 56 and the gas inlet branch pipes 54. Thus, the SiH4 gas is fed into the casing 32 through the gas nozzles 52 to fill the casing 32. At this time, an exhaust system is shifted from the position where it is connected to the diffusion pump and the rotary pump (not shown) to the position where it is connected to the mechanical booster pump 66 and the rotary pump 68. In this gas introducing state, the pressure inside the casing 32 ranges from 0.1 torr to 4.0 torr. The stands 44 are driven by the first drive mechanism 46 to cause the bases 42 to start both rotation and revolution.

Thereafter, a given voltage from the power source 74 is applied between the first and second gas inlet portions 48 and 50 and the bases 42 to cause glow discharge, thereby activating, radicalizing and ionizing the SiH4 gas. Activated species are attracted to the outer peripheral surface of each base 42 to deposit an α-Si film thereon. That is, an α-Si film as a photosensitive layer is deposited on the outer peripheral surface of the base 42. The discharge is continued for a given time until the α-Si film develops to a predetermined thickness. Since the bases 42 both rotate and revolve at the same time, the α-Si film developed as prescribed can be uniform in thickness both with respect to each individual base 42 and with respect to all of the sixteen bases 42.

When the photosensitive layer of α-Si finishes developing to the predetermined thickness, the power source 74 is cut off to stop the glow discharge. At the same time, the valve 58 is closed to stop the SiH4 gas supply. The mechanical booster pump 66 and the rotary pump 68 keep on exhausting gas remaining in the casing 32. The exhaust gas is cleaned by the air cleaning mechanism 70, and discharged into the outside air. After the residual gas in the casing 32 is removed, the casing 32 is removed from the base section 30, and the photosensitive drums on the stands 44, i.e., the drum-shaped bases 42 with the photosensitive layers of α-Si deposited on their outer peripheral surfaces, are collected. Thus, the sixteen photosensitive drums can be produced at once by a single cycle of film depositing operation.

According to the first embodiment, as described in detail above, sixteen photosensitive drums can be manufactured at a time without longitudinally piling up the bases 42. The bases 42 revolve around the central axis of the base section 30 as they rotate about their own axes. Therefore, the photosensitive layers on the individual photosensitive drums can of uniform thickness. Moreover, since the sixteen photosensitive drums are arranged on the same plane during manufacture, the operating efficiency is improved.

It is to be understood that this invention is not limited to the aforementioned first embodiment, and that various changes and modifications may be effected therein by one skilled in the art without departing from the scope or spirit of the invention.

Although the bases 42 are arranged on the same plane or in a layer in the first embodiment, they may be arranged in two layers. An experiment conducted by the inventor revealed that the uniform thickness of the photosensitive layers may be substantially maintained even if the drum-shaped bases are arranged in two layers.

Figure 7:
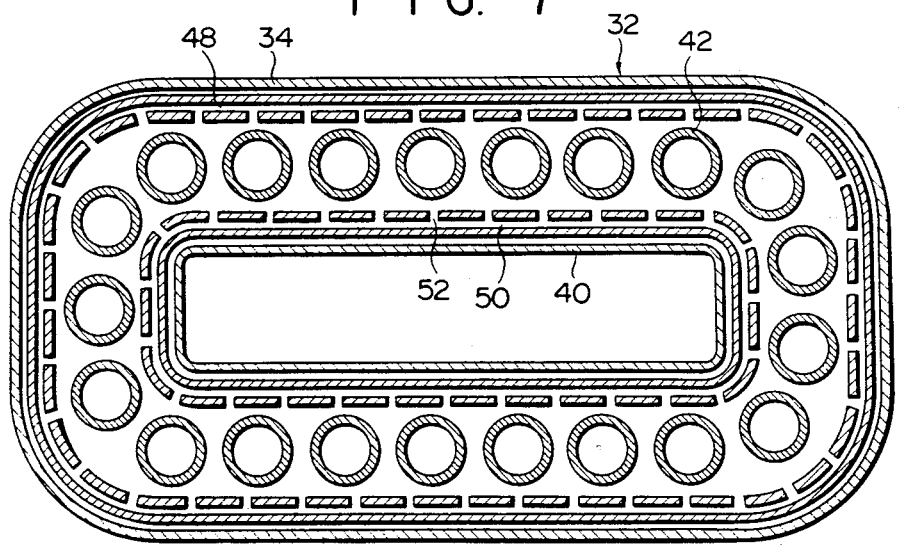
FIG. 7 is a cross-sectional view schematically showing a film depositing apparatus according to a second embodiment of the invention.

In the first embodiment, the locus of revolution of each base 42 is described as circular. However, the revolution locus may be elliptic or in the form of a rounded rectangle, as shown as a second embodiment in FIG. 7.

In the first embodiment, moreover, the gas supplied from the gas supplying mechanism is a mixture of SiH4 plus at least one of O2, CH4 and N2 or a mixture of SiH4 plus either B2H6 or PH3.

Referring now to FIGS. 8 to 20, a film depositing method and an apparatus therefore according to a third embodiment of this invention will now be described in detail. In the description to follow, like reference numerals are used to designate the same portions as in the first embodiment.

Figure 8:
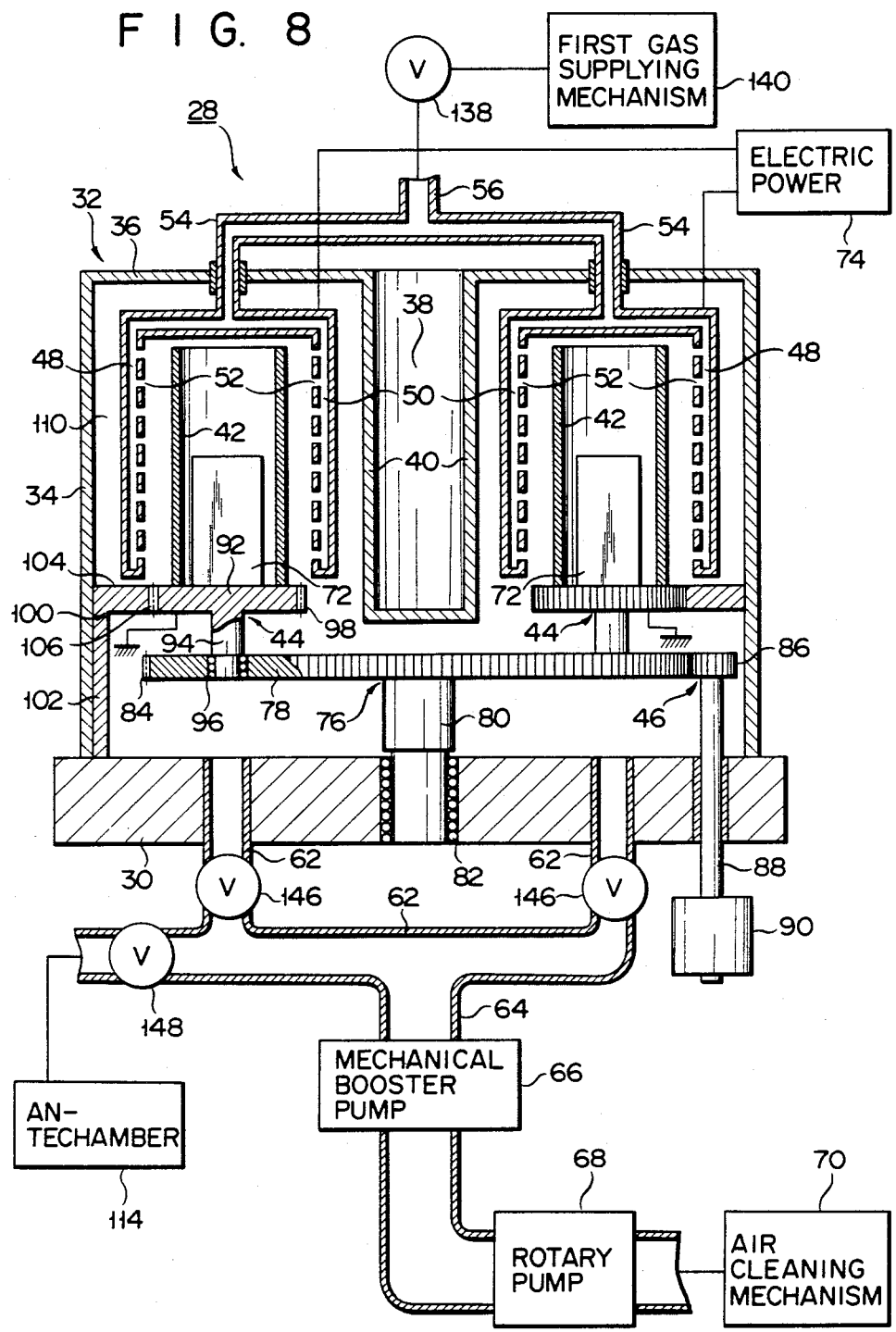
FIG. 8 is a longitudinal sectional view of a film depositing apparatus according to a third embodiment of the invention.

As shown in FIG. 8, the casing 32 is fixedly attached to the base section 30. The doughnut-shaped space surrounded by the base section 30 and the casing 32 is defined as a film depositing chamber 110.

Figure 9:
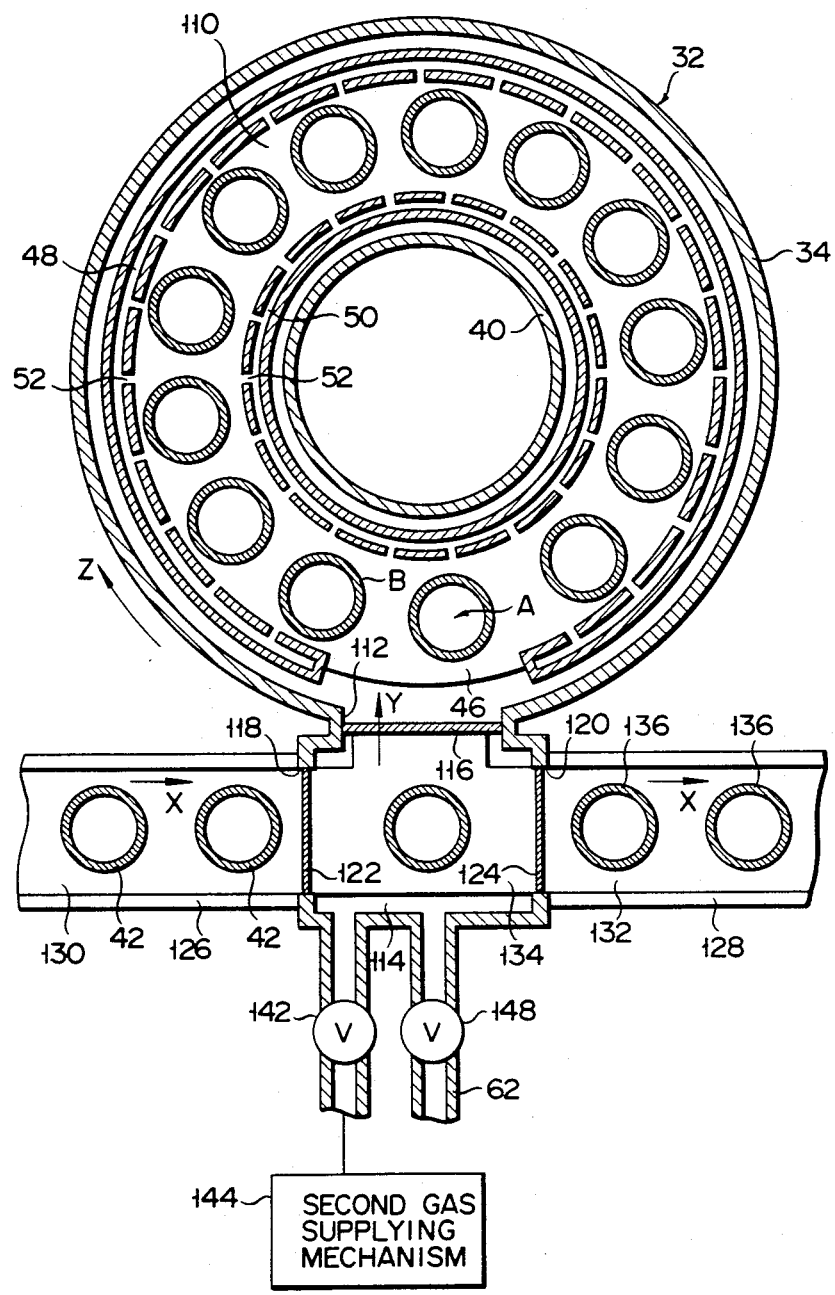
FIG. 9 is a cross-sectional view of the apparatus of FIG. 8.

As shown in FIG. 9, an opening 112 is formed in part of the outer peripheral wall 34 of the casing 32. The opening 112 is defined as a gate for the bases 42, and is wide enough to allow the passage of each base 42. An antechamber 114 with a rectangular plane shape is connected to the outside of the outer peripheral wall 34 of the casing 32. One lateral face of the antechamber 114 includes the opening 112. The opening 112 is fitted with a first shutter 116 capable of opening and closing the same. When the first shutter 116 is opened, the film depositing chamber 110 is connected to the antechamber 114. When the first shutter 116 is closed, the two chambers are hermetically isolated from each other.

An inlet opening portion 118 is formed in the lateral face of the antechamber 114 which adjoins the left-hand side (FIG. 9) of the one lateral face including the opening 112. Likewise, an outlet opening portion 120 is formed in that lateral face of the antechamber 114 which adjoins the right-hand side of the one lateral face. The inlet and outlet opening portions 118 and 120 are provided with second and third shutters 122 and 124, respectively, capable of opening and closing the same. When the second and third shutters 122 and 124 are opened, the antechamber 114 is connected to the outside. When both these shutters 122 and 124 are closed, the antechamber 114 is cut off from the outside in an airtight manner. The terminal end of a feed path 126 and the starting end of a delivery path 128 face the inlet and outlet opening portions 118 and 120, respectively. Second and third drive mechanisms 130 and 132 overlie the feed and delivery paths 126 and 128, respectively, and a fourth drive mechanism 134 is disposed in the antechamber 114. The second drive mechanism 130 is so constructed as to transfer the bases 42 in the direction indicated by an arrow X, and to carry the bases 42 onto the fourth drive mechanism 134 in the antechamber 114 while the second shutter 122 is open. The third drive mechanism 132 transfers the filmed bases 42 or photosensitive drums 136 from the antechamber 114 in the direction of the arrow X. The fourth drive mechanism 134 carries the bases 42 fed into the antechamber 114 through the inlet opening portion 118 onto the first drive mechanism 46 in the film depositing chamber 110 in the direction indicated by an arrow Y while the first shutter 116 is open, and, after completion of the film depositing operation, takes each photosensitive drum 136 opposed to the first shutter 116 into the antechamber 114 in the direction opposite to the direction of the arrow Y while the first shutter 116 is open. The fourth drive mechanism 134 also delivers the photosensitive drums 136 onto the third drive mechanism 132 over the delivery path 128 in the direction of the arrow X while the third shutter 124 is open.

Inside the casing 32, the first and second gas inlet portions 48 and 50 are arranged along the outer and inner peripheral walls 34 and 40, respectively. The first gas inlet portion 48 has an opening corresponding to the opening 112 with the first shutter 116.

The gas inlet main pipe 56 is connected to a first gas supplying mechanism 140 through a first valve 138. The first gas supplying mechanism 140 is intended to supply $SiH_4$ gas. The gas inlet branch pipes 54 penetrate the top plate of the casing 32 in an airtight manner to be led into the casing 32. A second gas supplying mechanism 144 is connected to the antechamber 114 through a second valve 142. The second gas supplying mechanism 144 is intended to supply $N_2$ gas. One end of each of the gas outlet branch pipes 62 penetrating the base section 30 and the antechamber 114 open on the top surface of the base section 30 and into the antechamber 114 through third and fourth valves 146 and 148, respectively.

There will now be described the film depositing operation of the apparatus according to the third embodiment constructed in the aforementioned manner.

First, a plurality of bases 42 are arranged on the second drive mechanism 130 over the feed path 126 along the driving direction, as shown in FIG. 10. Then, the first and second shutters 116 and 122 are opened, and the third shutter 124 is closed. In this state, the second drive mechanism 130 drives a leading base 42A in the driving direction or the direction of the arrow X to feed it into the antechamber 114, as shown in FIG. 11. The fourth drive mechanism 134 in the antechamber 114 drives the leading base 42A in the direction of the arrow Y to carry it onto the stand 44 of the first drive mechanism 46, as shown in FIG. 12.

Figure 12:
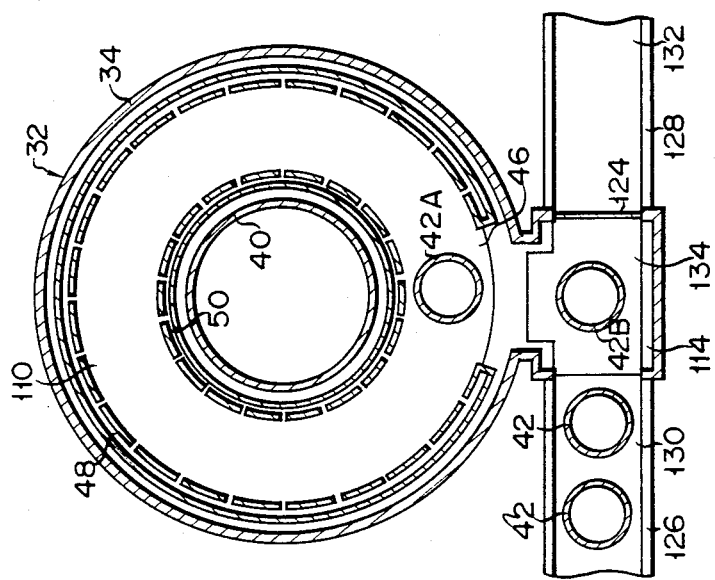

As the leading base 42A is carried into the film depositing chamber 110, a subsequent base 42B is located in the antechamber 114, as shown in FIG. 12.

In the state shown in FIG. 12, the second shutter 122 is closed, the third and fourth valves 146 and 148 are open, and the film depositing chamber 110 and the antechamber 114 are evacuated by means of the diffusion pump and the rotary pump (not shown). When the internal pressures of these chambers 110 and 114 reach $10^{-5}$ torr, the third and fourth valves 146 and 148 are closed, and the first shutter 116 is closed. Also, the bases 42 are heated from 200° C. to 300° C. by the heaters 72. Then, the first valve 138 is opened to lead the $SiH_4$ gas from the first gas supplying mechanism 140 to the first and second gas inlet portions 48 and 50 via the gas inlet main pipe 56 and the gas inlet branch pipes 54. Thus, the $SiH_4$ gas permeates the whole film depositing chamber 110 through the gas nozzles 52. At this time, the third valve 146 is opened to start discharge of the gas inside the casing 32 by means of the mechanical booster pump 66 and the rotary pump 68. Under the gas introducing and discharging conditions, the pressure inside the film depositing chamber 110 may range from 0.1 torr to 4.0 torr.

Thereafter, a given voltage from the power source 74 is applied between the first and second gas inlet portions 48 and 50 and the bases 42 to cause glow discharge, thereby activating the $SiH_4$ gas. Activated species are attracted to the outer peripheral surface of each base 42 to deposit an α-Si film thereon. That is, an α-Si film as a photosensitive layer is deposited on the outer peripheral surface of the base 42.

The first drive mechanism 46 transfers the stands 44 carrying the bases 42 thereon in the film depositing chamber 110 in the direction indicated by an arrow Z. The transfer speed of the stands 44 moved by the first drive mechanism 46 is set so that a film with a given thickness may be deposited on each base 42 during the time interval between the instant that each stand 44 starts at a position A in FIG. 9 and the time it returns to position A after making a complete round of the film depositing chamber 110.

Figure 13:
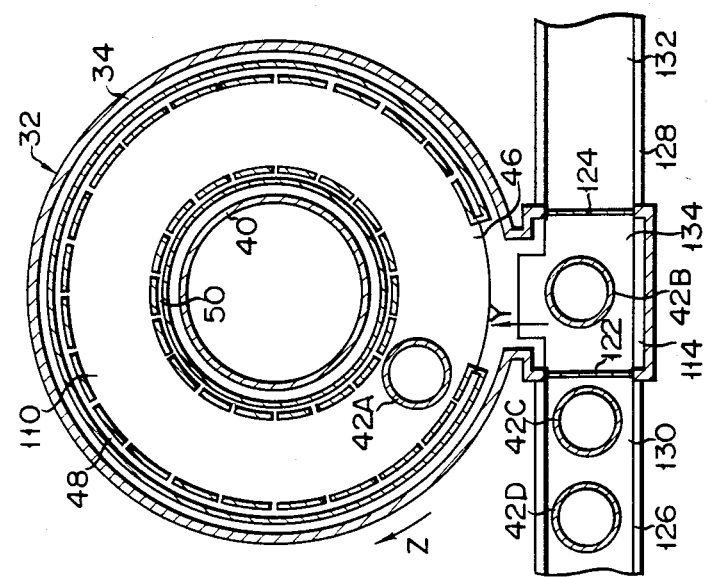

When the leading base 42A, along with the stand 44 carrying the same, is transferred to a position B in FIG. 9, so that a subsequent stand 44 is moved to that portion of the film depositing chamber 110 which faces the leading shutter 116, the first shutter 116 is opened, as shown in FIG. 13, and the base 42B in the antechamber 114 is transferred onto the stand 44 at position A on the first drive mechanism 46 by the agency of the fourth drive mechanism 134. Thereafter, in order to remove the $SiH_4$ gas in the antechamber 114, the fourth valve 148 is opened, and the antechamber 114 is evacuated by means of the rotary pump 68 and the mechanical booster pump 66. When a predetermined vacuum is formed in the antechamber 114, the fourth valve 148 is closed, and the second valve 142 is opened to inject $N_2$ gas from the second gas supplying mechanism 144 into the antechamber 114, thereby breaking the vacuum.

Thereafter, the second shutter 122 is opened, and another base 42C, having until this time been on standby on the feed path 126 adjacent to the antechamber 114, is moved into the antechamber 114 by the second drive mechanism 130. Then, the second shutter 122 is closed, the fourth valve 148 is opened, and a predetermined vacuum is formed in the antechamber 114 by means of the mechanical booster pump 66 and the rotary pump 68. When the base 42B at position A inside the film depositing chamber 110 is transferred to position B, the first shutter 116 is opened, and the base 42C in the antechamber 114 is transferred onto the base 44 at position A by the fourth drive mechanism 134. This operation is continued until the leading base 42A has returned to position A after making a complete round of the film depositing chamber 110, as shown in FIG. 14. The film forming operation in the film depositing chamber 110 is continued even while the bases 42 are being transferred from the antechamber 114 to the film depositing chamber 110. The bases 42 on the stands 44 moved in the film depositing chamber 110 by the first drive mechanism 46 are rotated about their central axes through the engagement between the second gears 98 of the rests 92 of the stands 44 and the fixed gear 106. That is, the bases 42 moving in the film depositing chamber 110 also rotate about their own axes.

When the leading base 42A on the leading stand 44 has returned to position A after making a round of the film depositing chamber 110 while the film depositing operation is performed, a photosensitive layer of α-Si is deposited on the outer peripheral surface of the base 42A to a given uniform thickness. When the base 42A or the photosensitive drum 136 with the photosensitive layer thereon is transferred again to position A, a newly fed base 42 stands by not in the antechamber 114, but on the feed path 126. Then, after the antechamber 114 is evacuated, the first shutter 116 is opened, and the photosensitive drum 136 is transferred to the antechamber 114 by the fourth drive mechanism 134, as shown in FIG. 15. Thereafter, the first shutter 116 is closed, the fourth valve 148 is opened to remove the SiH$_4$ gas permeating the whole antechamber 114, and the antechamber 114 is evacuated by the mechanical booster pump 66 and the rotary pump 68. When the antechamber 114 attains a predetermined degree of vacuum, the fourth valve 148 is closed. At this time, the third valves 146 are opened, and the mechanical booster 66 and the rotary pump 68 operate to exhaust unnecessary SiH$_4$ gas. Then, the second valve 142 is opened, and the N$_2$ gas from the second gas supplying mechanism 144 is injected into the antechamber 114 to break the vacuum.

The SiH$_4$ gas exhausted from the antechamber 114 is cleaned by the air claning mechanism 70, and discharged into the outside air.

Figure 16:
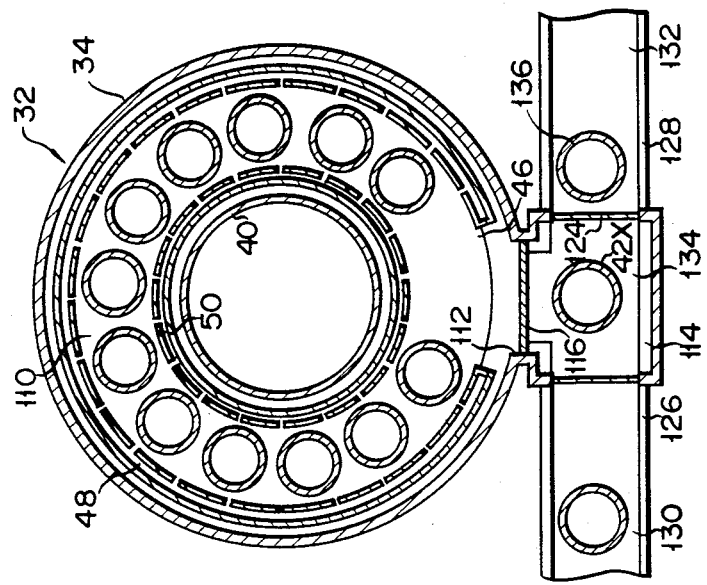
Figure 17:
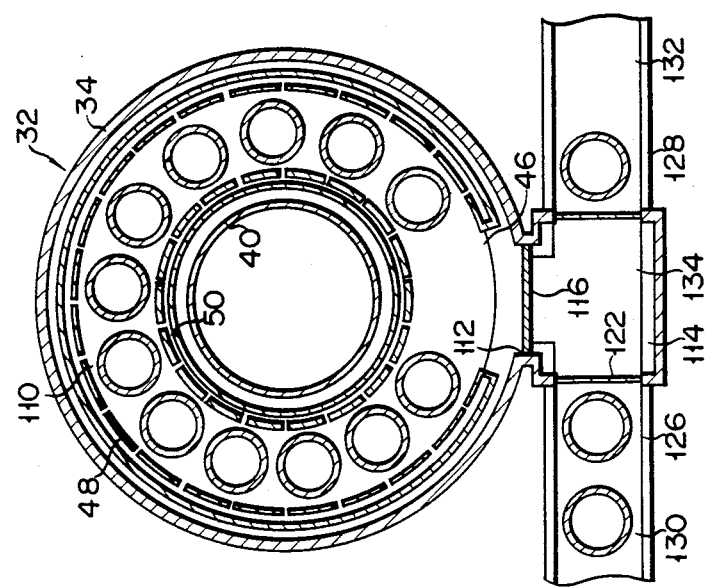
Figure 18:
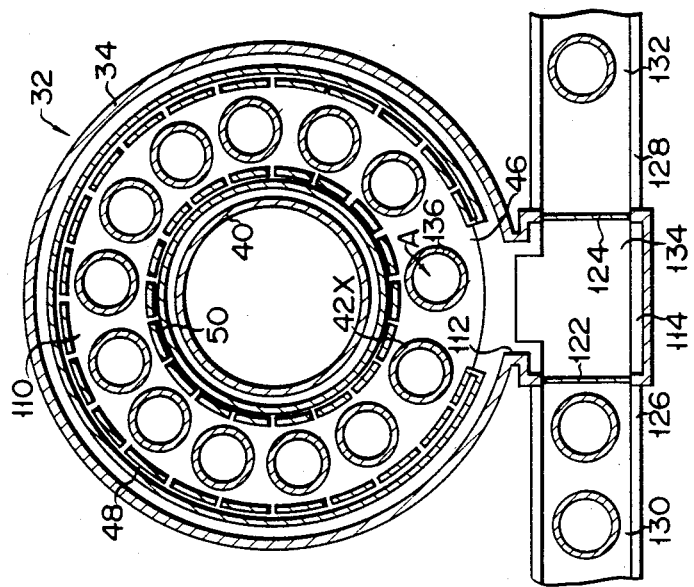

Thereafter, the third shutter 124 is opened, as shown in FIG. 16, and the photosensitive drum 136 in the antechamber 114 is transferred to the third drive mechanism 132 on the delivery path 128 by the fourth drive mechanism 134. Then, the third and second shutters 124 and 122 are closed and opened, respectively, and a base 42X on the feed path 126 is moved into the antechamber 114 by the second drive mechanism 130, as shown in FIG. 17. Then, the second shutter 122 is closed, and the antechamber 114 is evacuated. Thereafter, the first shutter 116 is opened, as shown in FIG. 18, and the base 42X in the antechamber 114 is transferred to a stand 44 at position A on the first drive mechanism 46 in the film depositing chamber 110 by the fourth drive mechanism 134.

Figure 19:
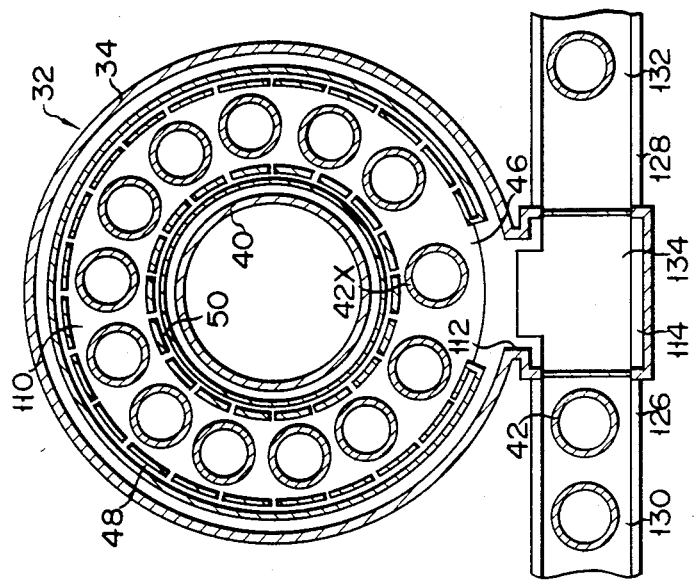
Figure 20:
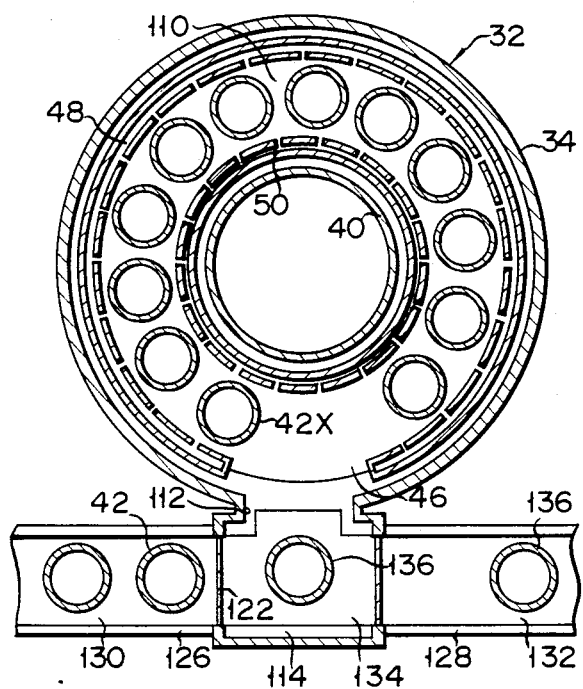

As the stand 44, which is carrying thereon the newly fed base 42X, moves from position A to position B, the stand 44, carrying the filmed photosensitive drum 136, is located at position A, as shown in FIG. 19. In this state, the photosensitive drum 136 is transferred from the film deposited chamber 110 to the antechamber 114 by the fourth drive mechanism 134, as shown in FIG. 20. Thereafter, the first shutter 116 is closed, and the antechamber 114 is evacuated in the aforesaid manner to remove the SiH$_4$ gas therein. Thereafter, the operations following the location of the photosensitive drum 136 at position A are repeated automatically until the whole depositing operation is completed.

According to the third embodiment, as described in detail above, in depositing an α-Si film on the outer peripheral surface of the drum-shaped base 42 to manufacture a photosensitive drum, the film depositing chamber 110 is always kept ready for film depositing. The small antechamber 114 is used to introduce a newly fed drum into the film depositing chamber 110. Thus, a newly fed base 42 can be led into the film depositing chamber 110 simultaneously with (and without hindering) the film depositing operation. The antechamber 114 is also used for the removal of the filmed drum-shaped base 42 or the photosensitive drum 136 from the film depositing chamber 110. Thus, the photosensitive drum 136 can be removed from the film depositing chamber 110 simultaneously with and without hindering the film depositing operation.

The antechamber 114 is just large enough to hold a single base 42. Therefore, the time required to form the predetermined vacuum in the antechamber 114 is quite short, and the film depositing operation is continued in the meantime. Thus, the evacuation will never lower the film depositing efficiency of the whole operation. Consequently, in prolonged manufacture of photosensitive drums according to the third embodiment, as compared with the prior art, a greater number of photosensitive drums can be completed per unit time.

Since the bases 42 moving in the film depositing chamber 110 also rotate about their own axes, the photosensitive layers on the photosensitive drums can be of uniform thickness. Also, the photosensitive layer on each individual photosensitive drum can enjoy a uniform thickness.

Moreover, since the antechamber 114 is used both for the feeding of the bases 42 and for the removal of the photosensitive drums 136, the evacuation of the antechamber requires very little power.

It is to be understood that this invention is not limited to the construction and operation of the aforementioned third embodiment, and that various changes and modifications may be effected therein by one skilled in the art without departing from the scope or spirit of the invention.

Figure 21:
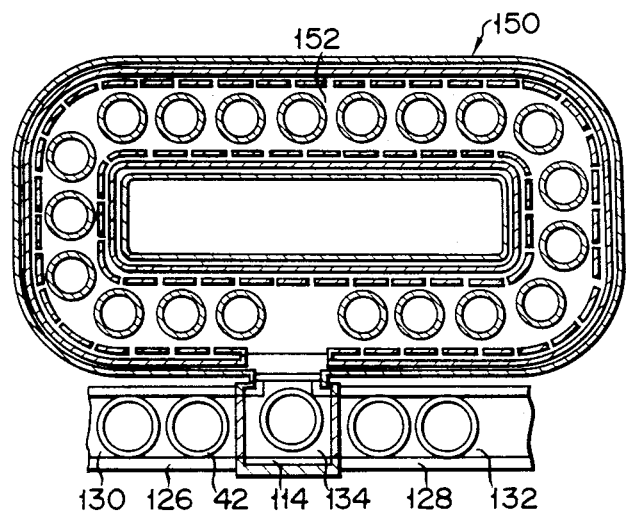
FIG. 21 is a cross-sectional view schematically showing a film depositing apparatus according to a fourth embodiment of the invention.

In the third embodiment, the locus of revolution of each base 42 is described as circular. However, the revolution locus may be elliptic or in the form of a rounded rectangle as shown as a fourth embodiment in FIG. 21. That is, a casing 150 and a film depositing chamber 152 may each have a substantially rectangular plane shape.

Figure 22:
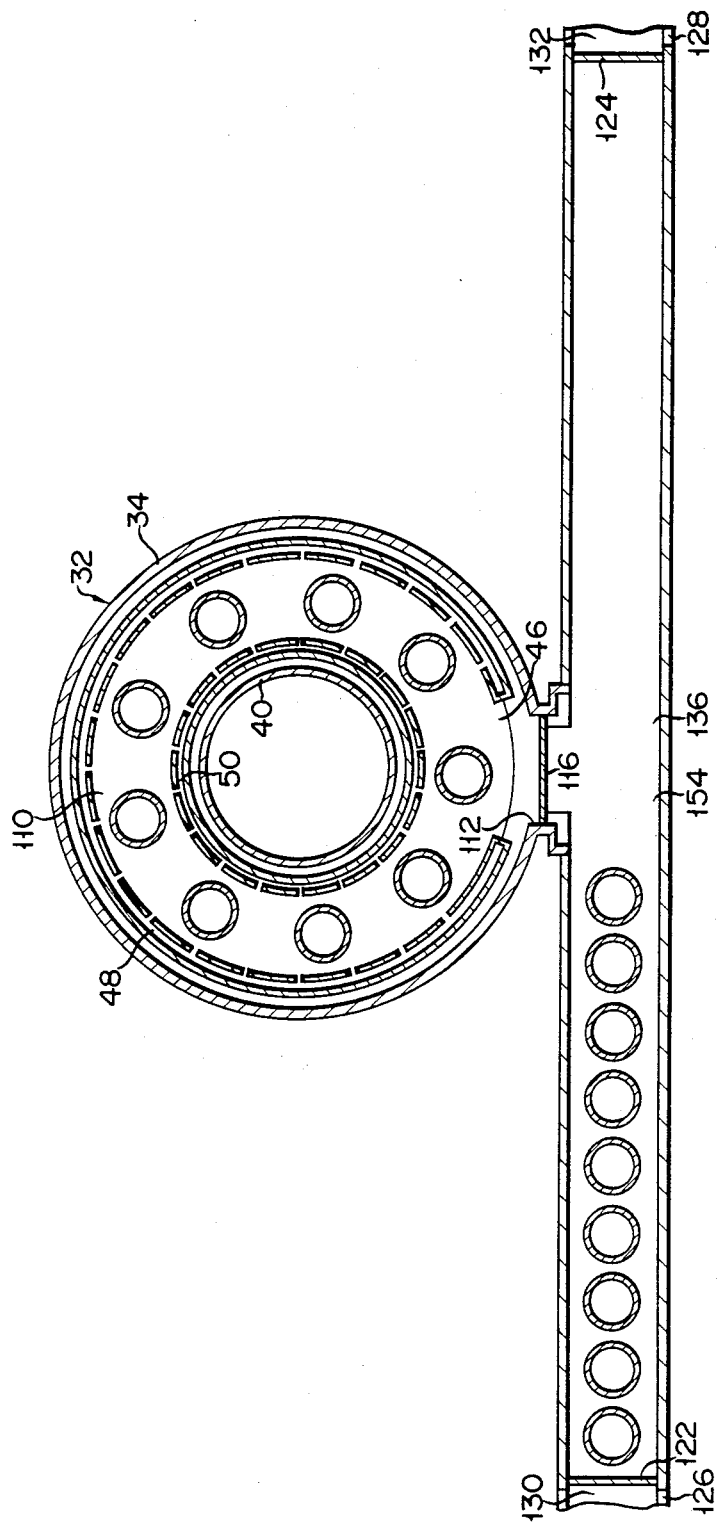
FIG. 22 is a cross-sectional view schematically showing a film depositing apparatus according to a fifth embodiment of the invention.

In the third embodiment, moreover, the antechamber 114 is described as just large enough to hold a single base 42. Alternatively, as shown as a fifth embodiment in FIG. 22, an antechamber 154 may be large enough to hold twice as many bases 42 as can be held at one time in the film depositing chamber 110. In this case, a multitude of bases 42 standing by in the antechamber 154 are led at a time into the film depositing chamber 110, and a multitude of photosensitive drums 136 filmed in the film depositing chamber 110 are led out again into the antechamber 154 at a time. The object of this invention will also be attained through such a construction and operation.

Referring now to FIGS. 23 to 33, a film depositing apparatus according to a sixth embodiment of this invention will be described in detail.

Figure 23:
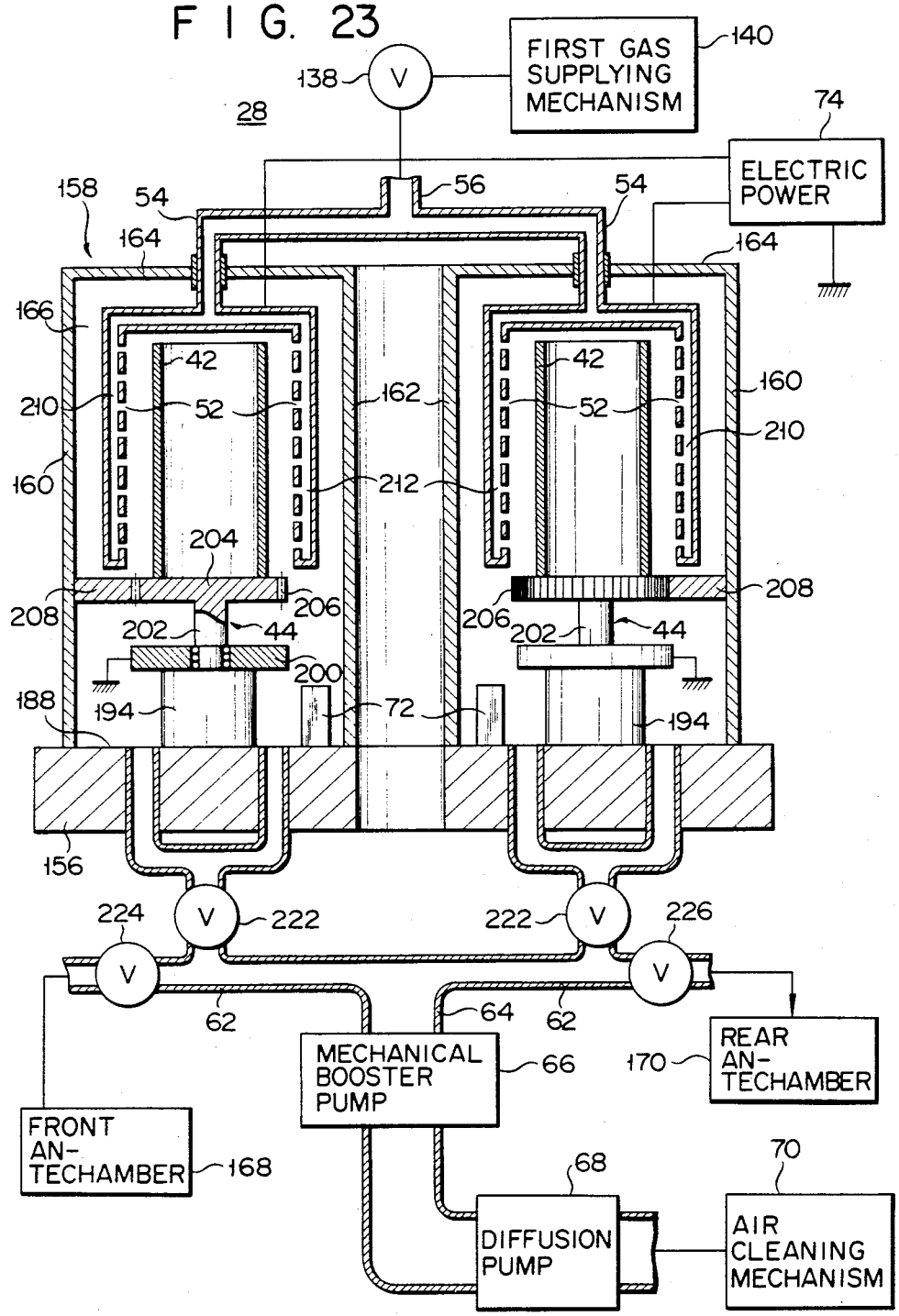
FIG. 23 is a longitudinal sectional view shematically showing a film depositing apparatus according to a sixth embodiment of the invention.
Figure 24:
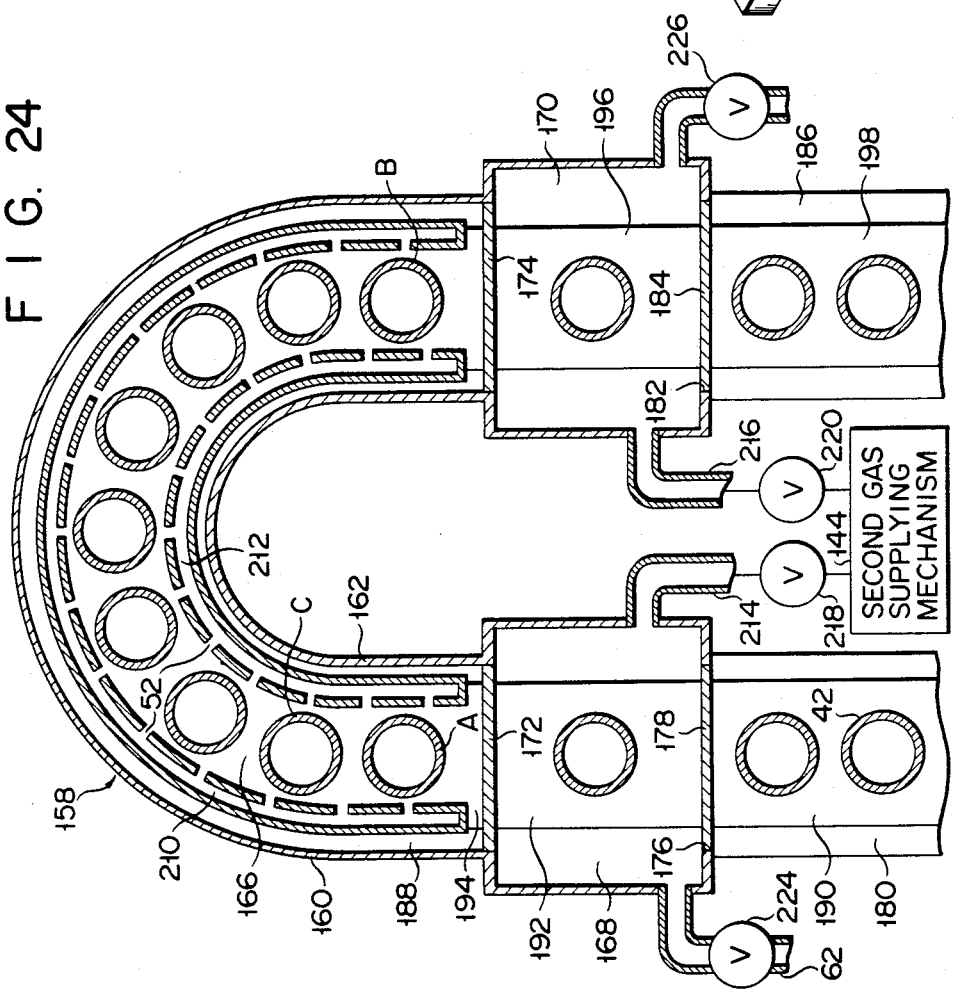
FIG. 24 is a cross-sectional view of the apparatus of FIG. 23.

As shown in FIGS. 23 and 24, the film depositing apparatus 28 includes a base section 156 having a U-shaped plane. A casing 158 is fixedly mounted on the base section 156 so as to cover the whole upper surface thereof.

The casing 158 has an outer wall 160 standing upright along the outer peripheral edge of the base section 156, an inner wall 162 standing upright along the inner peripheral edge of the base section 156, and a top plate 164 connecting the respective upper end edges of the outer and inner walls 160 and 162. The U-shaped space surrounded by the base section 156 and the casing 158 is defined as a film depositing chamber 166. As shown in FIG. 24, a front antechamber 168 is connected to one end of the film depositing chamber 166, and a rear antechamber 170 is connected to the other end. A first shutter 172 is interposed between the front antechamber 168 and the film depositing chamber 166 in an openable manner. When the first shutter 172 is opened, the front antechamber 168 and the film depositing chamber 166 are connected. When the shutter 172 is closed, the two chambers 168 and 166 are isolated in an airtight manner. Likewise, a second shutter 174 is interposed between the rear antechamber 170 and the film depositing chamber 166 in an openable manner. When the second shutter 174 is opened, the rear antechamber 172 and the film depositing chamber 166 are connected. When the shutter 174 is closed, the two chambers 172 and 166 are isolated in an airtight manner.

An inlet opening portion 176 is formed at that portion of the front antechamber 168 which faces the first shutter 172. The inlet opening portion 176 is provided with a third shutter 178 capable of opening and closing the same. The front antechamber 168 is connected to and disconnected from the outside space when the third shutter 178 is opened and closed, respectively. The terminal end of a feed path 180 faces the inlet opening portion 176.

An outlet opening portion 182 is formed at that portion of the rear antechamber 170 which faces the second shutter 174. The outlet opening portion 182 is provided with a fourth shutter 184 capable of opening and closing the same. The rear antechamber 170 is connected to and disconnected from the outside space when the fourth shutter 184 is opened and closed, respectively. The starting end of a delivery path 186 faces the outlet opening portion 182.

Inside the casing 158, a transfer path 188 overlies the base section 156. The feed path 180, front antechamber 168, transfer path 188, rear antechamber 170, and delivery path 186 are provided with first to fifth drive mechanisms 190, 192, 194, 196 and 198, respectively, which move the stands 44, each carrying a drum-shaped base 42 for a photosensitive drum, in the direction of the arrow X. The first drive mechanism 190 carries the stand 44 on the feed path 180 into the front antechamber 168. The second drive mechanism 192 carries the stand 44 in the front antechamber 168 onto the transfer path 188. The third drive mechanism 194 carries the stand 44 on the transfer path 188 into the rear antechamber 170. The fourth drive mechanism 196 carries the stand 44 in the rear antechamber 170 onto the delivery path 186. The fifth drive mechanism 198 carries the stand 44, which has been carried onto the delivery path 186 by the fourth drive mechanism 196, to a delivery portion (not shown).

Each of the front and rear antechambers 168 and 170 is large enough to hold a single stand 44. The film depositing chamber 166 is large enough to hold a plurality of stands 44, e.g., nine, at a time.

Figure 25:
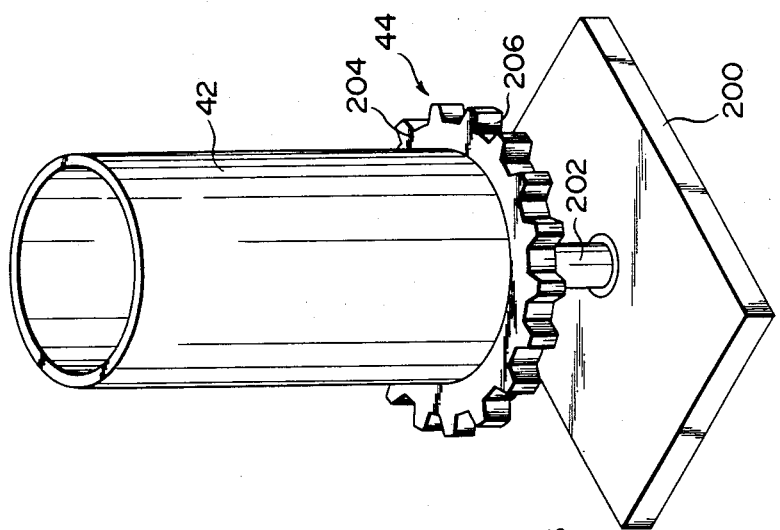
FIG. 25 is an isolated perspective view showing a stand, along with a base, used in the apparatus of FIG. 23.

As shown in FIG. 25, each stand 44 comprises a table 200 to engage the first to fifth drive mechanisms 190, 192, 194, 196 and 198, a shaft 202 attached to the substantially central portion of the table 200 and rotatable about its vertical axis, and a discoid rest 204 fixed at the central portion to the upper end of the shaft 202. A gear 206 is formed over the whole outer peripheral surface of the rest 204. Each base 42 is put on the substantially central portion of the rest 204. A rack 208 to mesh with the gear 206 is attached to that portion of the outer wall 160 of the casing 156 which faces the rest 204 of the stand 44. The rack 208 extends along the full length of the transfer path 188. Therefore, the rest 204 of the stand 44 rotates about its own axis as it is moved along the transfer path 188 by the third drive mechanism 194.

In side the casing 158, first and second gas inlet portions 210 and 212 are arranged along the outer and inner walls 160 and 162, respectively. First and second gas inlet pipes 214 and 216 are connected to the front and rear antechambers 168 and 170, respectively. The gas inlet pipes 214 and 216 are connected to the aforesaid second gas supplying mechanism 144 through second and third valves 218 and 220, respectively. The second gas supplying mechanism 144 is intended to supply a nonpoisonous inert gas, e.g., $N_2$ gas.

One end of each of a number of gas outlet branch pipes 62 penetrate the base section 156 and each has a fourth valve 222 open on the upper surface of the base section 156. The gas outlet branch pipes 62 also open into the front and rear antechambers 168 and 170 through fifth and sixth valves 224 and 226, respectively. The gas outlet branch pipes 62 are coupled to the common gas outlet main pipe 64.

There will now be described the film depositing operation of the apparatus according to the sixth embodiment constructed in the aforementioned manner.

First, the bases 42 are set individually on the stands 44 on the feed path 180, the first, second and third shutters 172, 174 and 178 are opened, and the fourth shutter 184 is closed, as shown in FIG. 26. In this state, the first drive mechanism 190 carries the base 42A on the leading stand 44 to the front antechamber 168 in the advancing direction indicated by the arrow X. Then, the second drive mechanism 192 feeds the leading base 42A into the film depositing chamber 166, as shown in FIG. 27. As the leading base 42A is carried into the film depositing chamber 116, the next base 42B is located in the front antechamber 168, as shown in FIG. 27.

In the state shown in FIG. 27, the third shutter 178 is closed, the fourth to sixth valves 222, 224 and 226 are opened, and the film depositing chamber 166 and the front and rear antechambers 168 and 170 are evacuated by means of the diffusion pump and the rotary pump (not shown). When the internal pressures of these chambers 166, 168 and 170 reach $10^{-5}$ torr, the fourth to sixth valves 222, 224 and 226 are closed, the first and second shutters 172 and 174 are closed, as shown in FIG. 28, and the base 42A is heated to 200° C. to 300° C. by the heater 72. Then, the first valve 138 is opened, and the $SiH_4$ gas is led from the first gas supplying mechanism 140 to the first and second gas inlet portions 210 and 212 through the gas inlet main pipe 56 and the gas inlet branch pipes 54. Thus, the $SiH_4$ gas permeates the whole film depositing chamber 166 through the gas nozzles 52. At this time, the valve 222 is opened, and excess $SiH_4$ gas is discharged by the mechanical booster pump 66 and the rotary pump 68. Under the gas introducing and discharging conditions, the internal pressure of the film depositing chamber 166 is adjusted within a range of 0.1 torr to 4.0 torr.

Thereafter, a given voltage from the power source 74 is applied between the first and second gas inlet portions 210 and 212 and the base 42A to cause glow discharge, thereby activating the $SiH_4$ gas. Activated species are attracted to the outer peripheral surface of the base 42A to deposit an $\alpha$-Si film thereon. That is, an $\alpha$-Si film as a photosensitive layer is deposited on the outer peripheral surface of the base 42A.

The third drive mechanism 194 transfers the stand 44 carrying the base 42A thereon on the transfer path 188 in the direction of the arrow X. The transfer speed of the stand 44 moved by the third drive mechanism 194 is set so that a film with a given thickness may be deposited on the base 42A during the time interval from the instant that the stand 44 starts at a position A in FIG. 24 until it reaches a position B. Here position A on the transfer path 188 corresponds to that portion of the feed path 188 which adjoins the front antechamber 168, and position B corresponds to that portion of the transfer path 188 which adjoins the rear antechamber 170.

When the base 42A on the leading stand 44 is transferred to a position C in FIG. 24 to leave a space wide enough to hold another stand 44 between itself and the front antechamber 168, the first shutter 172 is opened, and the base 42B on the stand 44 in the front antechamber 168 is transferred to position A by the second drive mechanism 192, as shown in FIG. 29. Thereafter, the first shutter 172 is closed, the fifth valve 224 is opened while the fourth and sixth valves 222 and 226 are opened and closed, respectively, to remove the SiH$_4$ gas in the front antechamber 168 and the front antechamber 168 is evacuated by means of the rotary pump 68 and the mechanical booster pump 66. When a predetermined vacuum is formed in the front antechamber 168, the fourth valve 222 is opened to continue the removal of the gas inside the casing, the fifth and second valves 224 and 218 are closed and opened, respectively, and N$_2$ gas from the second gas supplying mechanism 144 is injected into the front antechamber 168 through the first gas inlet pipe 214 to break the vacuum. Then, the second valve 218 is closed.

Thereafter, the third shutter 178 is opened, as shown in FIG. 30, and a base 42C on another stand 44, having so far been on stand-by on the feed path 180 adjacent to the front antechamber 168, is moved into the front antechamber 168 by the first drive mechanism 190. Then, the third shutter 178 is closed, and only the fifth valve 224 is opened to form a predetermined vacuum in the front antechamber 168 by means of the mechanical booster pump 66 and the rotary pump 68. When the base 42B in the position A of FIG. 24 inside the film depositing chamber 166 is transferred to the position B, the first shutter 172 is opened, and the base 42C on the stand 44 in the front antechamber 168 is transferred to the position A on the transfer path 188 by the second drive mechanism 192. Thereafter, this operation is repeated automatically until the bases 42 disappear from the feed path 180.

The film depositing operation in the film depositing chamber 166 is continued even while the bases 42 are being transferred from the front antechamber 168 to the film depositing chamber 166. The bases 42 on the stands 44, which are moved on the transfer path 188 by the third drive mechanism 194, are rotated about their central axes through the engagement between the rests 204 of the stands 44 and the rack 208. That is, the bases 42 moving on the transfer path 188 also rotate about their own axes.

When the leading base 42A on the leading stand 44 is transferred to position B of FIG. 24 on the transfer path 188 while the film depositing operation is being performed, as shown in FIG. 31, a photosensitive layer of α-Si is formed on the outer peripheral surface of the base 42A to a given uniform thickness. When the base 42A or the photosensitive drum 136 with the photosensitive layer thereon is transferred to position B, the second shutter 174 is opened, and the photosensitive drum 136 is transferred to the rear antechamber 170 by the third drive mechanism 194. Then, the second shutter 174 is closed, as shown in FIG. 32, the fourth and sixth valves 222 and 226 are opened to remove the SiH$_4$ gas permeating the whole rear antechamber 170, and the rear antechamber 170 is evacuated by the mechanical booster pump 66 and the rotary pump 68. When the rear antechamber 170 attains a predetermined degree of vacuum, the pumps 66 and 68 are stopped, the sixth and third valves 226 and 220 are closed and opened, respectively, and the N$_2$ gas from the second gas supplying mechanism 144 is injected into the rear antechamber 170 through the second gas inlet pipe 216 to break the vacuum.

The SiH$_4$ gas exhausted from the front and rear antechambers 168 and 170 and the film depositing chamber 166 is cleaned by the air cleaning mechanism 70, and discharged into the outside air.

Thereafter, the fourth shutter 184 is opened, as shown in FIG. 33, and the photosensitive drum 136 on the stand 44 in the rear antechamber 170 is transferred onto the delivery path 186 by the fourth drive mechanism 196. Then, the fourth shutter 184 is closed, the sixth valve 226 is opened, and a predetermined vacuum is formed in the rear antechamber 170 by the mechanical booster pump 66 and the rotary pump 68. Thereafter, this operation is repeated automatically until the whole depositing operation is completed.

According to the sixth embodiment, as described in detail above, in depositing an α-Si film on the outer peripheral surface of the drum-shaped base 42 to manufacture a photosensitive drum, the film depositing chamber 166 is always kept ready for film depositing. The small front antechamber 168 is used to introduce a newly fed drum-shaped base 42 into the film depositing chamber 166. Thus, the newly fed base 42 can be led into the film depositing chamber 110 simultaneously with the film deposition without hindering the film depositing operation. Moreover, the small rear antechamber 170 is used to remove the filmed drum-shaped base 42 or the photosensitive drum 136 from the film depositing chamber 166. Thus, the photosensitive drum 136 can be removed from the film depositing chamber 166 simultaneously with the film depositing operation without hindering it.

Each of the front and rear antechambers 168 and 170 is just large enough to hold a single base 42. Therefore, the time required to form the predetermined vacuum in the antechambers 168 and 170 is quite short, and the film depositing operation is continued during this time. Thus, the evacuation will never lower the film depositing efficiency for the whole operation. That is, in prolonged manufacture according to the sixth embodiment, as compared with the prior art, a greater number of α-Si photosensitive drums can be completed per unit time.

Since the bases 42 moving in the film depositing chamber 166 also rotate about their own axes, the photosensitive layers on the photosensitive drums can be of uniform in thickness. Also, the photosensitive layer on each individual photosensitive drum can enjoy a uniform thickness.

It is to be understood that this invention is not limited to the construction and operation of the aforementioned sixth embodiment, and that various changes and modifications may be effected therein by one skilled in the art without departing from the scope or spirit of the invention.

In the sixth embodiment, the plane configuration of the film depositing chamber 166 is described as U-shaped. However, the same effect may be obtained with use of an I-shaped or straight film depositing chamber 228 as shown as a seventh embodiment in FIG. 34.

In the sixth embodiment, moreover, each of the front and rear antechambers 168 and 170 is described as just large enough to hold a single base 42. Alternatively, as shown as an eighth embodiment in FIG. 35, each of the front and rear antechambers 230 and 232 may be large enough to hold as many bases 42 as can be held at one time in a film depositing chamber 234. In this case, a plurality of bases 42 standing by in the front antechamber 230 are led at one time into the film depositing chamber 234, and a plurality of photosensitive drums 136 filmed in the film depositing chamber 234 are led out into the rear antechamber 232 at a time. The object of this invention may also be attained through such a construction and operation. In the description of the seventh and eighth embodiments, like reference numerals are used to designate the same portions as included in the sixth embodiment.

In all the aforementioned embodiments, the base is described as drum-shaped. Instead of being drum-shaped, however, the base may be of any other suitable shape, e.g., a flat shape.

Furthermore, the film material is not limited to silicon, and the filmed bases may be applied to other suitable systems than photosensitive bodies, e.g., solar cells.

What is claimed is:

1. A film depositing apparatus which deposits a film with a given thickness on each of a plurality of substrates, said apparatus comprising:
   a base section;
   a casing removably mounted on the base section to form a sealed film depositing chamber;
   transfer means for transferring the plurality of substrates in one direction inside the film depositing chamber;
   gas supplying means for supplying a material gas into the film depositing chamber of the casing; and
   electric discharge means for activating the material gas supplied to the film depositing chamber by the gas supplying means.

2. The film depositing apparatus according to claim 1, wherein said gas supplying means includes injecting means arranged along said one direction in the film depositing chamber to inject the material gas in the casing into the film depositing chamber along said one direction.

3. The film depositing apparatus according to claim 2, wherein said injecting means includes a pair of gas inlet portions extending along said one direction so as to face each other with the bases therebetween.

4. The film depositing apparatus according to claim 3, wherein each said gas inlet portion is formed of conductive material, and said electric discharge means includes a power source connected to said pair of gas inlet portions, and said substrates are grounded.

5. The film depositing apparatus according to claim 1, wherein said transfer means includes plural stand means moveable along said one direction and rotatable about their own axes.

6. A film depositing apparatus which deposits a film with a given thickness on each of a plurality of substrates, said apparatus comprising:
   a base section;
   a casing fixedly mounted on the base section to form a sealed interior film depositing chamber, said casing defining an antechamber exterior thereof;
   first transfer means in the film depositing chamber for endlessly moving the plurality of substrates in one direction from a predetermined portion of the film depositing chamber facing the antechamber;
   gas supplying means for feeding material gas into the film depositing chamber;
   electric discharge means for activating the material gas fed into the film depositing chamber by the gas supplying means;
   feeding means having a terminal end connected to the antechamber, for feeding the substrates one after another into the film depositing chamber;
   delivery means having a starting end connected to the antechamber, for carrying the substrates filmed in the film depositing chamber out of said film depositing chamber one after another; and
   pressure reducing means for selectively reducing the internal pressures of the film depositing chamber and the antechamber.

7. The film depositing apparatus according to claim 6, wherein said first transfer means includes means permitting the substrates to rotate about their own axes.

8. The film depositing apparatus according to claim 6, wherein said gas supplying means includes a pair of gas inlet portions extending along said one direction so as to face each other with the substrates therebetween.

9. The film depositing apparatus according to claim 8, wherein each said gas inlet portion is formed of conductive material, and said electric discharge means includes a power source connected to said pair of gas inlet portions, and said substrates are grounded.

10. The film depositing apparatus according to claim 6, wherein said first transfer means has a circular locus of movement.

11. A film depositing apparatus which deposits a film with a given thickness on each of a plurality of substrates, said apparatus comprising:
    a base section;
    a casing fixedly mounted on the base section to form a sealed film depositing chamber, said casing including a front antechamber at one end portion and a rear antechamber at the other end portion;
    conveyor means having starting and terminal ends and disposed in the film depositing chamber for carrying the plurality of substrates in one direction from the starting end thereof facing the front antechamber to the terminal end thereof facing the rear antechamber;
    gas supplying means for supplying material gas into the film depositing chamber;
    electric discharge means for activating the material gas supplied to the film depositing chamber by the gas supplying means;
    feeding means whose terminal end is connected to the front antechamber for feeding said substrates one after another into the film depositing chamber;
    delivery means whose starting end is connected to the rear antechamber for carrying said substrates filmed in the film depositing chamber out of said film depositing chamber one after another; and
    pressure reducing means for selectively reducing the internal pressures of the front and rear antechambers and the film depositing chamber.

12. The film depositing apparatus according to claim 11, wherein said conveyor means causes the bases to rotate about their own axes.

13. The film depositing apparatus according to claim 11, wherein said gas supplying means includes a pair of gas inlet portions extending along said one direction so as to face each other with the substrates therebetween.

14. The film depositing apparatus according to claim 13, wherein each said gas inlet portion is formed of conductive material, and said electric discharge means includes a power source connected to said pair of gas inlet portions, and said substrates are grounded.

15. A method for depositing a film with a given thickness on the surface of each of a plurality of substrates, said method comprising the steps of:
    (a) arranging the plurality of substrates on a feed path along a transfer direction;

(b) arranging the internal pressure of a film depositing chamber including an endless transfer path to lead material gas into the film depositing chamber;
(c) causing electric discharge inside the film depositing chamber to activate the material gas;
(d) feeding each of the substrates from the feed path to a predetermined portion of the transfer path in the film depositing chamber through an antechamber;
(e) endlessly driving the substrates in the film depositing chamber along the transfer path to transfer each of the substrates again to the predetermined portion of the transfer path; and
(f) carrying the filmed substrates returned to the predetermined portion of the transfer path to a delivery path via the antechamber.

16. The method according to claim 15, wherein said material gas contains at least silicon.

17. A method for depositing a film with a given thickness on the surface of each of a plurality of substrates, said method comprising the steps of:
(a) arranging the plurality of substrates on a feed path along a transfer direction;
(b) reducing the internal pressure of a film depositing chamber including a transfer path extending along one direction to lead material gas into the film depositing chamber;
(c) causing electric discharge inside the film depositing chamber to activate the material gas;
(d) feeding each of the substrates from the feed path to one end of the transfer path in the film depositing chamber through a front antechamber;
(e) transferring the substrates in the film depositing chamber along the transfer path to the other end thereof; and
(f) carrying the substrates transferred to the other end of the transfer path to a delivery path through a rear antechamber.

18. The method according to claim 17, wherein said material gas contains at least silicon.

* * * * *